US00RE41671E

(19) United States
(12) Reissued Patent
Kawashima

(10) Patent Number: US RE41,671 E
(45) Date of Reissued Patent: Sep. 14, 2010

(54) QUARTZ CRYSTAL TUNING FORK RESONATOR

(75) Inventor: Hirofumi Kawashima, Tokyo (JP)

(73) Assignee: Piedek Technical Laboratory (JP)

(21) Appl. No.: 11/818,545

(22) Filed: Jun. 14, 2007

Related U.S. Patent Documents

Reissue of:
(64) Patent No.: 6,911,765
Issued: Jun. 28, 2005
Appl. No.: 09/975,876
Filed: Oct. 11, 2001

(30) Foreign Application Priority Data

Oct. 31, 2000 (JP) ..... 2000-332160
Feb. 6, 2001 (JP) ..... 2001-029884

(51) Int. Cl.
*H01L 41/08* (2006.01)

(52) U.S. Cl. ..... 310/370
(58) Field of Classification Search ..... 310/370, 310/366, 361, 329, 367; 73/514; 331/156; *H01L 41/04, 41/08; H02N 2/00*
See application file for complete search history.

(56) References Cited

U.S. PATENT DOCUMENTS 4,379,244 A * 4/1983 Dinger ..... 310/370
4,384,232 A * 5/1983 Debely ..... 310/370
4,592,663 A * 6/1986 EerNisse et al. ..... 310/370
4,785,215 A * 11/1988 Blech ..... 310/329
5,824,900 A * 10/1998 Konno et al. ..... 310/370
6,724,271 B2 * 4/2004 Sakata et al. ..... 310/370

FOREIGN PATENT DOCUMENTS

JP 56065517 * 6/1981
JP 00044092 * 7/2000
JP 00223992 * 8/2000
WO WO0044092 * 7/2000

* cited by examiner

*Primary Examiner*—Walter Benson
*Assistant Examiner*—Karen B Addison
(74) *Attorney, Agent, or Firm*—Adams & Wilks

(57) ABSTRACT

A quartz crystal tuning fork resonator has quartz crystal tuning fork tines for undergoing vibration in an inverse phase. Each of the quartz crystal tuning fork tines has a first main surface and a second main surface opposite the first main surface, each of the first and second main surfaces having a central linear portion. The quartz crystal tuning fork tines extend from a quartz crystal tuning fork base. At least one groove is formed in the central linear portion of each of the first and second main surfaces of each of the quartz crystal tuning fork tines. A width of the groove in the central linear portion of one of the first and second main surfaces of each of the quartz crystal tuning fork tines is greater than or equal to a distance in the width direction of the groove measured from an outer edge of the groove to an outer edge of the tuning fork tine.

20 Claims, 16 Drawing Sheets

QUARTZ CRYSTAL TUNING FORK RESONATOR

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a quartz crystal tuning fork resonator, capable of operating in a flexural mode.

2. Background Information

Quartz crystal tuning fork resonators, which are capable of vibrating in a flexural mode, are widely used as a time standard in consumer products, wearable time-keeping equipment and communication equipment (such as wristwatches, cellular phones, and pagers). Recently, because of miniaturization and the light weight nature of these products, the need for a smaller quartz crystal tuning fork resonator capable of operating in a flexural mode and having a small series resistance and a high quality factor has arisen.

Heretofore, however, it has been impossible to obtain a conventional miniaturized, quartz crystal tuning fork resonator, capable of operating in a flexural mode, and having a small series resistance and a high quality factor. When miniaturized, the conventional quartz crystal tuning fork resonator capable of operating in a flexural mode, as shown in FIG. 22 (which has electrodes on the obverse faces 203, 207, reverse faces 204, 208 and the four sides 205, 206, 209, 210 of each tuning fork tine, and as also shown in FIG. 23, which is a cross-sectional view of the tuning fork tines of FIG. 22), has a smaller electromechanical transformation efficiency, which provides a small electric field (i.e. Ex becomes small), a large series resistance, and a reduced quality factor. In FIG. 22, a conventional tuning fork resonator 200 is shown with tuning fork tines 201, 202 and tuning fork base 211.

In addition, it has heretofore been impossible to obtain a quartz crystal tuning fork resonator, capable of operating in a flexural mode, and having a small frequency change over a wide temperature range of between −10° C. to +50° C., because the resonator typically has a temperature coefficient with a parabolic curve, and a second order temperature coefficient of approximately $-3.5\times10^{-8}/°$ C.$^2$. This value is comparatively large as compared with AT cut quartz crystal resonators vibrating in thickness shear mode.

Accordingly, it is, therefore, a general object of the present invention to provide embodiments of a quartz crystal tuning fork resonator, capable of operating in a flexural mode, which overcome or at least mitigate one or more of the above problems.

SUMMARY OF THE INVENTION

Embodiments of the present invention relate to the shape and electrode construction of a quartz crystal tuning fork resonator, capable of operating in a flexural mode, and in particular, to a novel shape and electrode construction for quartz crystal tuning fork resonator capable of operating in a flexural mode, for consumer products and communication equipment requiring miniaturized, high accuracy, shock proof and low priced quartz crystal resonators.

It is a specific object of the present invention to provide embodiments of a quartz crystal tuning fork resonator capable of operating in a flexural mode that are miniaturized and have a small series resistance RI and a high quality factor Q.

It is yet another specific object of the present invention to provide embodiments of a quartz crystal resonator tuning fork resonator capable of operating in a flexural mode, and having an excellent frequency temperature behaviour over a wide temperature range, of from about −10° C. to about +50° C.).

According to one aspect of the present invention, there is provided a quartz crystal tuning fork resonator capable of vibrating in a flexural mode, which comprises; a pair of tuning fork tines, attached to a tuning fork base, with at least one groove being provided in a central linear portion of each tuning fork tine, at least one first electrode being provided inside each groove, and at least one second electrode being provided on sides of the tuning fork tines, such that for each tuning fork tine the at least one second electrode has an opposite polarity to the at least one first electrode.

According to a second aspect of the present invention there is provided a quartz crystal tuning fork resonator capable of vibrating in a flexural mode, which comprises a pair of tuning fork tines, attached to a tuning fork base, with a plurality of grooves being provided on the tuning fork base where the tuning fork tines are attached thereto, and with a plurality of electrodes being provided in the grooves.

According to a third aspect of the present invention there is provided a quartz crystal tuning fork resonator capable of vibrating in a flexural mode, which comprises a pair of tuning fork tines, attached to a tuning fork base, with the tuning fork tines having step difference portions, and with there being at least one first electrode on the step difference portions, and at least one second electrode on the sides of the tuning fork tines, such that the at least one first and at least one second electrodes are of opposite polarity.

According to a fourth aspect of the present invention there is provided a quartz crystal tuning fork resonator capable of vibrating in a flexural mode, which comprises a plurality of any of the foregoing individual quartz crystal tuning fork resonators capable of vibrating in a flexural mode, with each individual resonator having a pair of tuning fork tines attached to a tuning fork base, and with each individual resonator being connected and formed integrally at each tuning fork base wherein the individual quartz crystal resonators are coupled to each other at the respective tuning fork bases and have an angle of separation of from 0° to about 30°, and such that the resulting coupled resonator has an even numbered plurality of tuning fork tines.

Embodiments of the quartz crystal tuning fork resonators capable of vibrating in a flexural mode, according to the present invention, provide a high electromechanical transformation efficiency.

Embodiments of the quartz crystal tuning fork resonators capable of vibrating in a flexural mode, according to the present invention, use grooves or step differences and an electrode construction arranged on the tuning fork tines and/or tuning fork base.

According to one preferred embodiment, a resonator according to the present invention has grooves provided in a central linear portion of each tuning fork tine and electrodes disposed inside the grooves and on the sides of each tuning fork tine. According to other embodiments, alternatively or additionally, the grooves may be arranged on the tuning fork base with the electrodes also being disposed inside the grooves.

According to another preferred embodiment, the resonator has a step difference constructed at the tuning fork tines and/or the tuning fork base, and has electrodes disposed on the step difference portions.

According to yet another preferred embodiment, at least two individual quartz crystal tuning fork resonators are connected and formed integrally at their respective tuning fork base in order to improve the frequency-temperature behaviour of the device. The quartz crystal resonators, whose peak temperature points are different, may be electrically connected in parallel. As a result, the integrally formed quartz crystal resonator has excellent frequency-temperature behaviour over a wide temperature range, extending from about −10° C. to about +50° C.

BRIEF DESCRIPTION OF THE DRAWINGS

The present invention and the manner in which it is implemented may be more fully understood with reference to the following detailed description, examples, and accompanying drawings, in which.

DETAILED DESCRIPTION OF THE PREFERRED EMBODIMENTS

Figure 1:
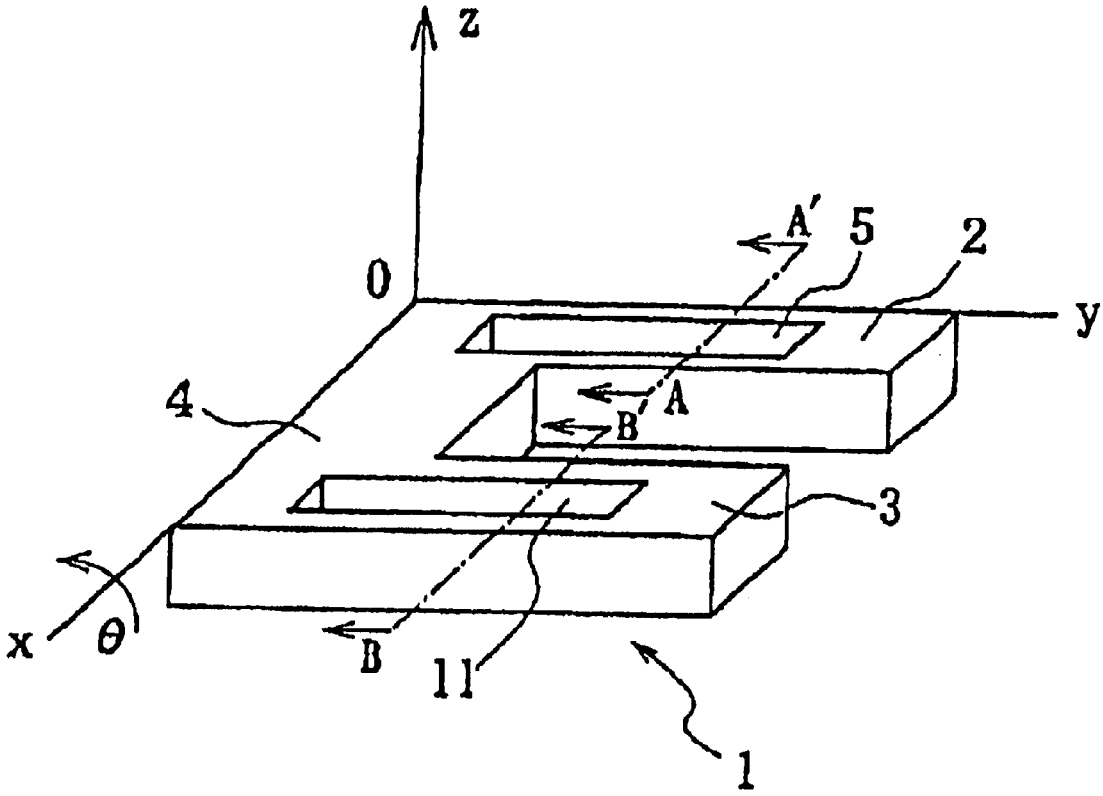
FIG. 1 is a general view of a quartz crystal tuning fork resonator of the present invention, capable of vibrating in a flexural mode, and having grooves at each tuning fork tine.

Referring now to the drawings, the embodiments of the present invention will be described in full detail.

Embodiment 1

Figure 2:
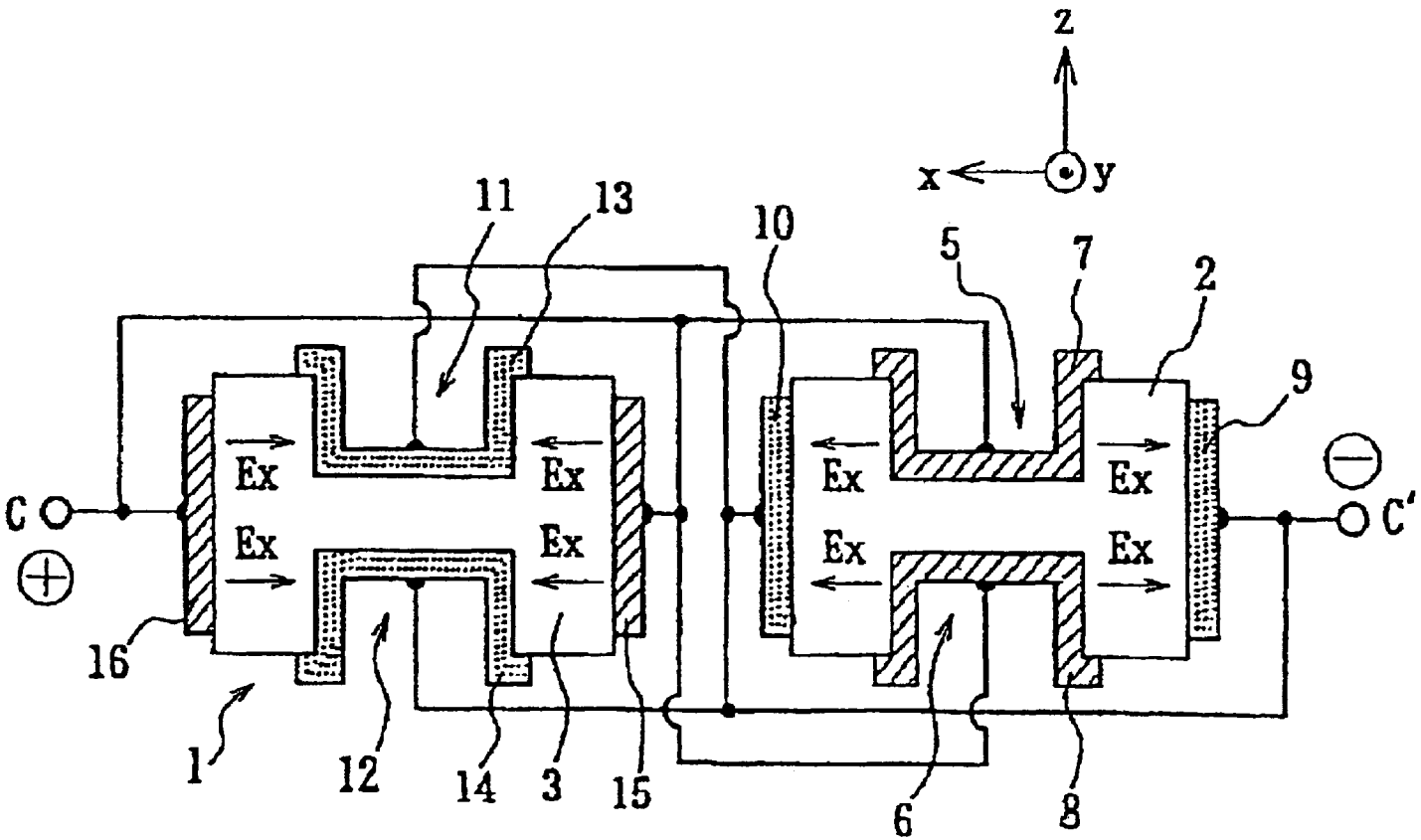
FIG. 2 is a cross-sectional view through A–A' and B–B' of the tuning fork tines of FIG. 1, showing the electrode construction.

FIG. 1 shows a general view of one embodiment of a quartz crystal tuning fork resonator, capable of vibrating in a flexural mode, according to the present invention, together with a reference coordinate system. The reference coordinate system consists of an origin O, an electrical axis x, a mechanical axis y, and an optical axis z of quartz, namely, O-xyz. A quartz crystal tuning fork resonator 1, capable of vibrating in a flexural mode, according to the present invention generally comprises a first tuning fork tine 2, a second tuning fork tine 3, a tuning fork base 4, to which the first tuning fork tine 2 and the second tuning fork tine 3 are attached. Additionally, grooves 5 and 11 are formed on an obverse face of tuning fork tines 2 and 3, in a portion of a central liner portion of each tine, respectively, as shown in FIG. 2. Corresponding identical grooves are formed on a reverse face of the tines 2 and 3. A cut angle $\theta$, which has a typical value of from 0° to about 10°, is formed by rotating the resonator about the x-axis through a plane perpendicular to the z-axis.

FIG. 2 shows cross-sectional views through A–A' and B–B' of the tuning fork tines of the resonator of FIG. 1, and details of the electrode construction within the grooves. The A—A' cross-sectional view of tuning fork tine 2 is shown on the right side and the B—B' cross-sectional view of tuning fork tine 3 is shown on the left side. Tuning fork tine 2 has grooves 5 and 6 cut into it, in an area covering a portion of central liner region of the tine 2. The grooves 5 and 6 have a first set of electrodes 7 and 8 of the same electrical polarity, while sides of the tine 2 have a second set of electrodes 9 and 10 having an opposite electrical polarity to the first set of electrodes 7 and 8. The tuning fork tine 3 has grooves 11 and 12 constructed in a similar manner as tuning fork tine 2. The grooves 11 and 12 have a third set of electrodes 13 and 14 of the same electrical polarity, and the sides of the tine 3 have a fourth set of electrodes 15 and 16, with an opposite electrical polarity to the third electrodes 13 and 14. The electrodes disposed on the tuning fork tines 2 and 3 are electrically connected as shown in FIG. 2, forming two electrode terminals C-C', of opposite electrical polarity.

In detail, the first set of electrodes 7 and 8 disposed on the grooves 5 and 6 of tuning fork tine 2 have the same electrical polarity as the fourth set of electrodes 15 and 16 disposed on both sides of tuning fork tine 3, while the second set of electrodes 9 and 10 disposed on both sides of tuning fork tine 2 have the same electrical polarity as the third set of electrodes 13 and 14 disposed on the grooves 11 and 12 of tine 3. When a direct voltage is applied between the electrode terminals C-C', an electric field Ex occurs along the arrow direction inside the tuning fork tines 2 and 3. As the electric field Ex occurs perpendicular to the electrodes disposed on the tuning fork tines, as shown by the arrow symbols. The electric field Ex has a very large value and a large distortion occurs at the tuning fork tines. As a result, a quartz crystal tuning fork resonator vibrating in a flexural mode, and having a small series resistance $R_1$ and a high quality factor Q is obtained, with there being a large electromechanical transformation efficiency for the resonator, even though miniaturized.

Figure 3:
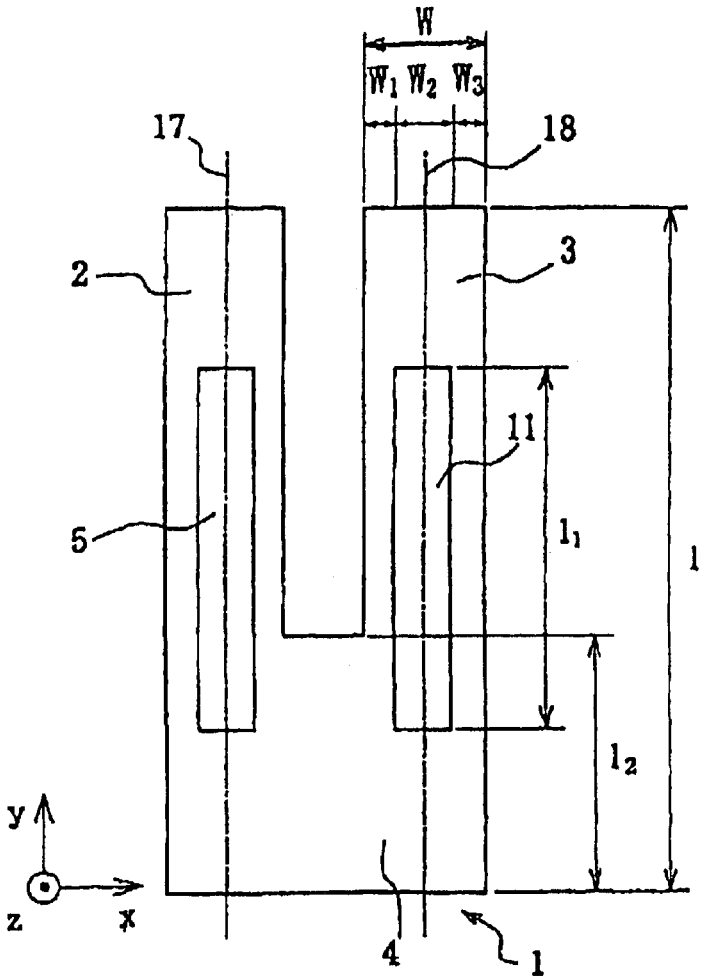
FIG. 3 is a plan view of the quartz crystal tuning fork resonator of FIG. 1.

FIG. 3 shows a plan view of the quartz crystal tuning fork resonator 1 of FIG. 1. In FIG. 3, the construction and the dimension of grooves 5 and 11 are shown in detail. Groove 5 is formed to include a portion of the central linear region 17 of tuning fork tine 2; groove 11 is similarly formed to include a portion of the central linear region 18 of tuning fork tine 3. Grooves 5 and 11 have a width $W_2$, which includes a portion of the central linear regions 17 and 18 respectively, is preferable because the tuning fork tines 2 and 3 can vibrate in flexural mode very easily. A quartz crystal tuning fork resonator, capable of vibrating in a flexural mode with a small series resistance $R_1$ and a high quality factor Q is possible according to the present invention. The total width W of the tuning fork tines 2 and 3 has a relationship of $W=W_1+W_2+W_3$, and in general the grooves are constructed so that $W_1=W_3$. In addition, the width $W_2$ of the grooves is constructed so that $W_2 \geqq W_1$, $W_3$. The length $l_1$ of the grooves 5 and 11 of tuning fork tines 2 and 3 extends into the tuning fork base 4 (which has a length dimension $l_2$) Furthermore, the total length l is determined by the frequency requirement and the size of the housing case. In this embodiment the grooves 5 and 11 of tuning fork tines 2 and 3 extend into the tuning fork base 4 in series, however, in other embodiments of the present invention a plurality of grooves divided in the length direction of the tuning fork tines are provided.

Figure 4:
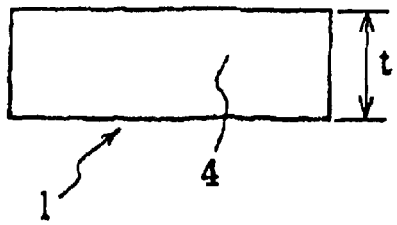
FIG. 4 is a bottom view of FIG. 3.

FIG. 4 shows a bottom view of the quartz crystal tuning fork resonator 1 of FIG. 3, which has a thickness dimension t. In the embodiments shown in FIG. 1 to FIG. 3, the tuning fork tines have a total of four grooves within the obverse and the reverse faces thereof, with one groove in each of the two faces of each of the two tines, and electrodes provided inside the grooves, as well as electrodes disposed on two sides of the tuning fork tines. Other embodiments of the present invention, however, may have only one groove within a single surface of the tuning fork tines and an electrode inside each of those grooves, as well as electrodes disposed on both sides of each of the tuning fork tines. Furthermore, each of the first electrodes inside the grooves and each of the second electrodes on the sides of the tines, adjacent to the first electrodes, are of opposite electrical polarity.

Embodiment 2

Figure 5:
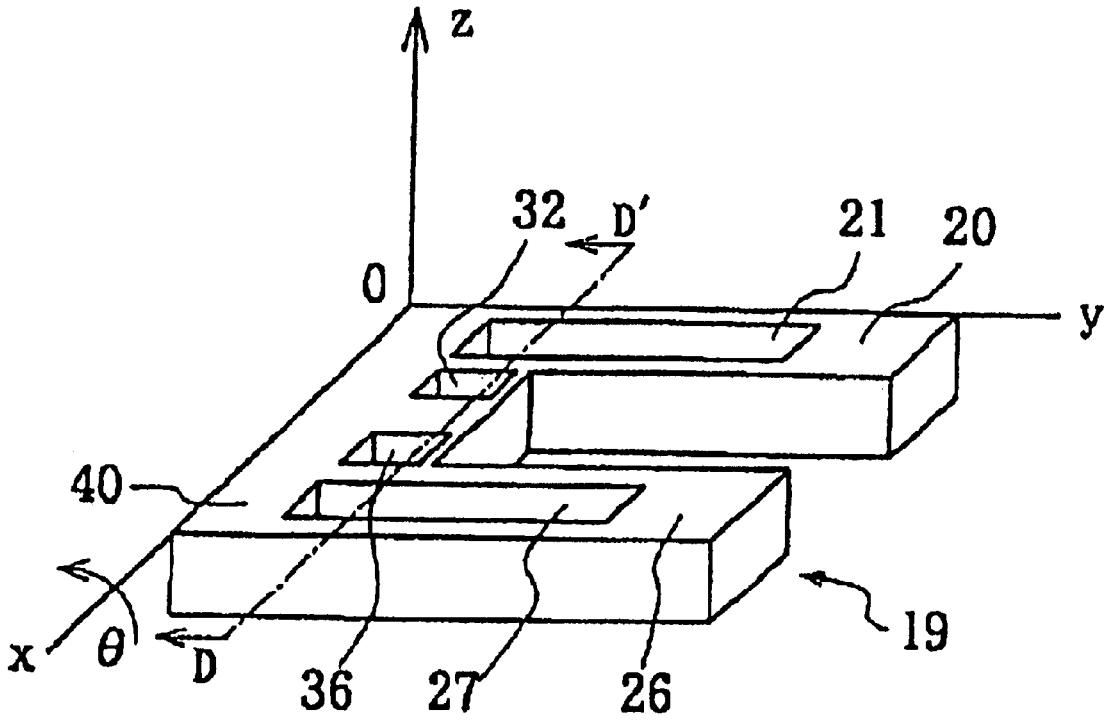
FIG. 5 is a general view of a quartz crystal tuning fork resonator, capable of vibrating in a flexural mode, according to the present invention, and having a plurality of grooves at a base of the tuning fork.

FIG. 5 shows a general view of another embodiment of a quartz crystal tuning fork resonator 19 of the present invention, capable of vibrating in a flexural mode, and its coordinate system O-xyz. A cut angle θ, which has a typical value of from 0° to about 10°, is formed by rotating the resonator about the x-axis through a plane perpendicular to the z-axis.

The quartz crystal tuning fork resonator 19, capable of vibrating in a flexural mode, comprises two tuning fork tines 20 and 26, attached to tuning fork base 40. The tuning fork tines 20 and 26 have grooves 21 and 27, respectively, with the grooves 21 and 27 extending into the tuning fork base 40. In addition, the tuning fork base 40 has additional grooves 32 and 36.

Figure 6:
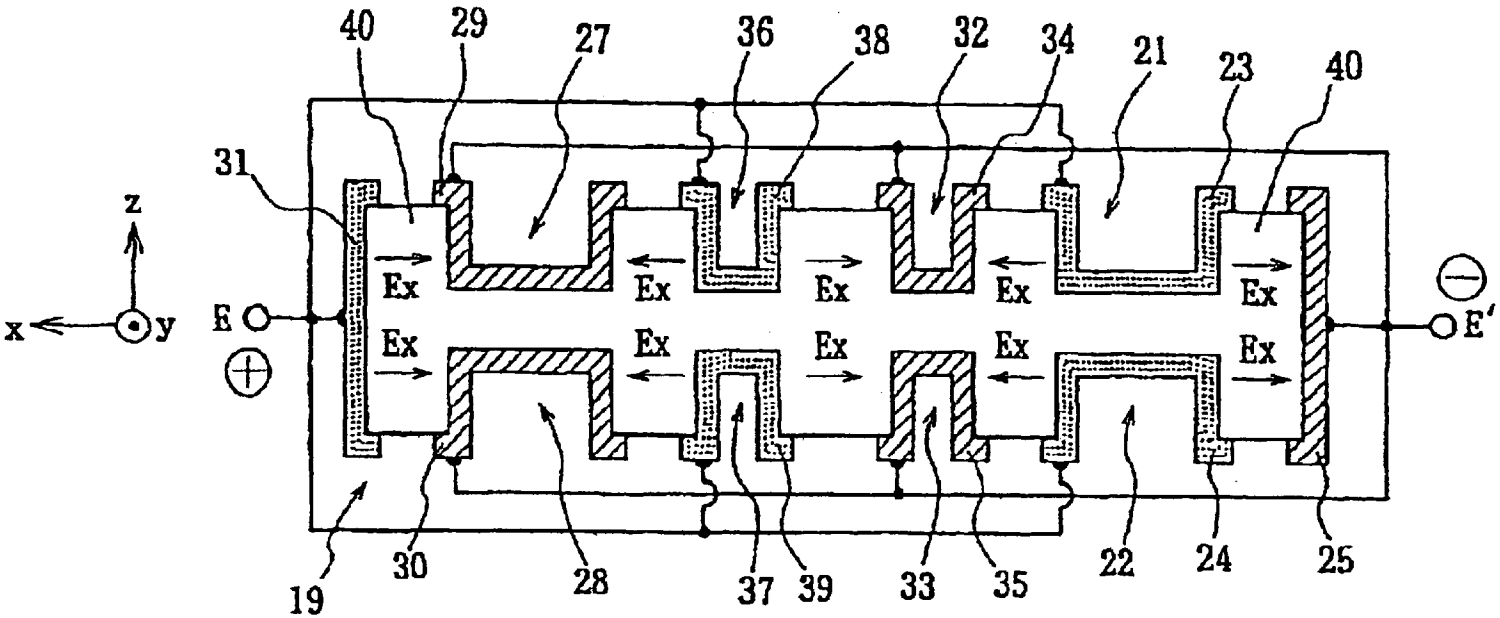
FIG. 6 is a cross-sectional view through D–D' of the tuning fork base of FIG. 5, showing the electrode construction.

FIG. 6 shows a cross-sectional view through D-D' of the tuning fork base 40 for the quartz crystal tuning fork resonator 19, capable of vibrating in a flexural mode, of FIG. 5. In FIG. 6, the shape of the electrode construction within the tuning fork base 40 for the quartz crystal tuning fork resonator of FIG. 5 is shown in detail. The section of the tuning fork base 40, to which the tuning fork tine 20 is attached, has grooves 21 and 22 cut into the obverse and the reverse faces, respectively, of the base 40. The section of the tuning fork base 40, to which tuning fork tine 26 is attached has grooves 27 and 28 cut into the obverse and reverse faces, respectively, of the base 40. In addition to these grooves, the tuning fork base 40 has grooves 32 and 36 cut between grooves 21 and 27, and the base 40 further has grooves 33 and 37 cut between grooves 22 and 28.

Additionally, grooves 21 and 22 have first electrodes 23 and 24, both of the same electrical polarity; grooves 32 and 33 have second electrodes 34 and 35, both of the same electrical polarity; grooves 36 and 37 have third electrodes 38 and 39, both of the same electrical polarity, and grooves 27 and 28 have fourth electrodes 29 and 30, also both of the same electrical polarity. The sides of the base 40 have fifth and sixth electrodes 25 and 31, respectively, each of opposite electrical polarity. The fifth, fourth, and second electrodes 25, 29, 30, 34 and 35 have the same electrical polarity, while the first, sixth and third electrodes 23, 24, 31, 38 and 39 also have the same electrical polarity, which is opposite to the electrical polarity of the other electrodes, mentioned above. The individual electrodes are electrically connected and two electrode terminals E–E' are constructed. The electrodes disposed inside the grooves opposite each to each other in the thickness (z-axis) direction of the tuning fork tines have the same electrical polarity. Also, the electrodes disposed opposite to each other across adjoining grooves have an opposite electrical polarity to one another.

When a direct voltage is applied between the electrode terminals E–E' (e.g., with the E terminal being the positive (+) terminal, having a positive electrical polarity; and the E' terminal being the negative (−) terminal, having a negative electrical polarity), an electric field Ex occurs, having an orientation as shown by the arrows in FIG. 6. Because the electric field Ex occurs perpendicular to the electrodes disposed on the tuning fork base, the electric field Ex has a very large value and a large distortion occurs at the tuning fork base, so that the quartz crystal tuning fork resonator operates in a flexural mode, and has a small series resistance $R_1$ and a high quality factor Q, even though the resonator is miniaturized.

Figure 7:
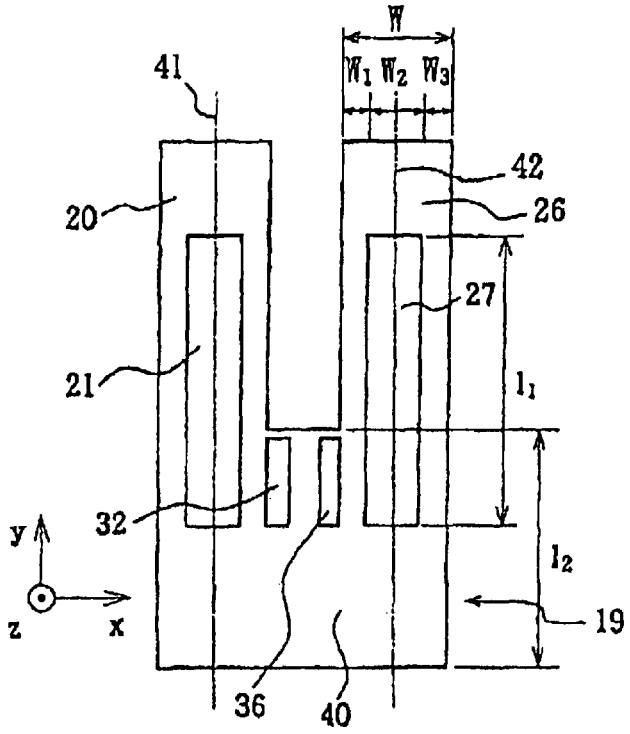
FIG. 7 is a plan view of the quartz crystal tuning fork resonator of FIG. 5.

FIG. 7 shows a plan view of the quartz crystal tuning fork resonator 19 of FIG. 5. In FIG. 7, the disposition of the grooves 21 and 27 is shown in detail. The tuning fork tine 20 has groove 21 cut thereinto, such that the groove includes a portion of the central liner region 41 of the tuning fork tine, and the tuning fork tine 26 also has groove 27 cut thereinto, such that the groove includes a portion of the central linear region 42 of the tuning fork tine. A quartz crystal tuning fork resonator according to this embodiment of the present invention additionally has grooves 32 and 36 formed between the grooves 21 and 27 at the tuning fork base 40 where the tuning fork tines 20 and 26 are attached to the tuning fork base.

Thus, a quartz crystal tuning fork resonator capable of vibrating in a flexural mode, and having a shape and an electrode construction according to the embodiments of the present invention has excellent electrical characteristics, even though it is miniaturized. Such a quartz crystal resonator has a small series resistance $R_1$ and a high quality factor Q. The width dimension $W=W_1+W_2+W_3$, and length dimensions $l_1$ and $l_2$, of such a resonator are as described above with respect to the embodiment of FIG. 3.

Embodiment 3

Figure 8:
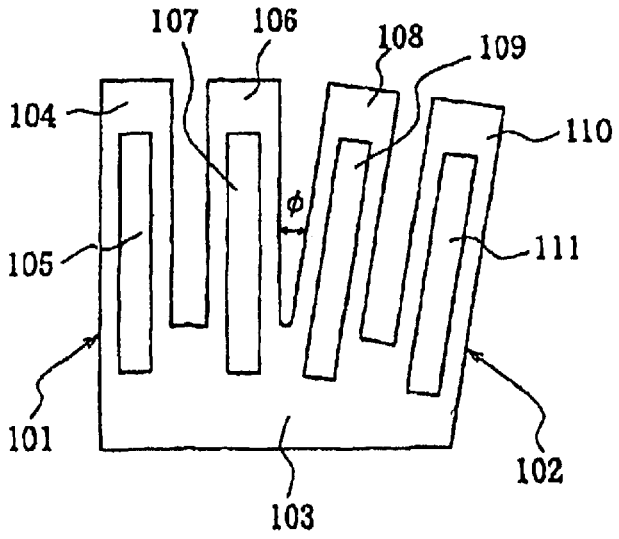
FIG. 8 is a plan view of two quartz crystal tuning fork resonators, capable of vibrating in a flexural mode, according to the present invention, connected at their tuning fork bases at an angle $\phi$.

FIG. 8 shows a plan view of another embodiment of a quartz crystal tuning fork resonator, capable of vibrating in a flexural mode, according to the present invention, having a plurality of resonators. Two quartz crystal tuning fork resonators 101, 102, capable of vibrating in a flexural mode, with each resonator having first and second tines, are connected and are integrally formed, with an angle $\phi$ of from 0° to about 30° between each tuning fork base 103. In addition, the tuning fork tines 104 and 106 of quartz crystal tuning fork resonator 101 have grooves 105 and 107, and the tuning fork tines 108 and 110 of the quartz crystal tuning fork resonator 102 have grooves 109 and 111.

Figure 9:
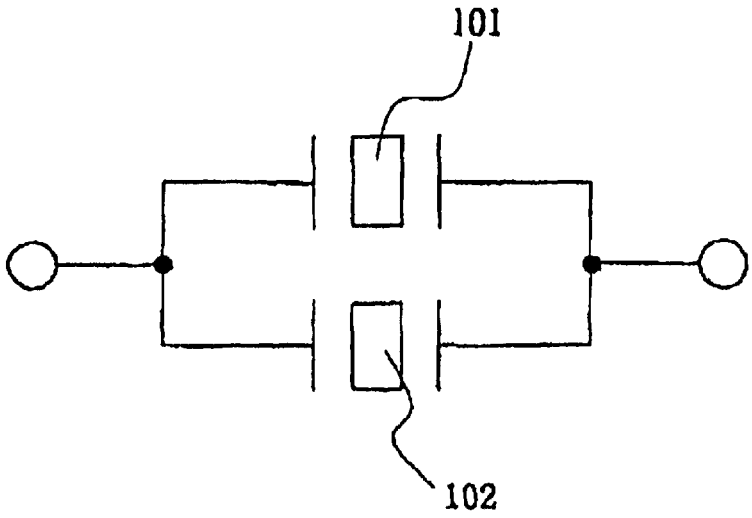
FIG. 9 is an electrical connection diagram for the quartz crystal tuning fork resonator of FIG. 8.

Because each quartz crystal tuning fork resonator capable of vibrating in a flexural mode has a different frequency temperature behaviour, dependent on the angle $\phi$, an improvement of the frequency-temperature behaviour for the quartz crystal tuning fork resonator is obtainable by electrically connecting the two quartz crystal tuning fork resonators in parallel. The objects of embodiments of the present invention are achievable even if the same-designed resonators have an angle $\theta=0°$ because quartz crystal tuning fork resonators capable of vibrating in a flexural mode, which are mass produced, exhibit a distribution of frequency-temperature behaviour due to manufacturing tolerances. In other words there will be small differences between the two resonators. An electrical connection diagram for both quartz crystal tuning fork resonators 101, 102 is shown in FIG. 9. The resonators are electrically connected in parallel.

Embodiment 4

Figure 10:
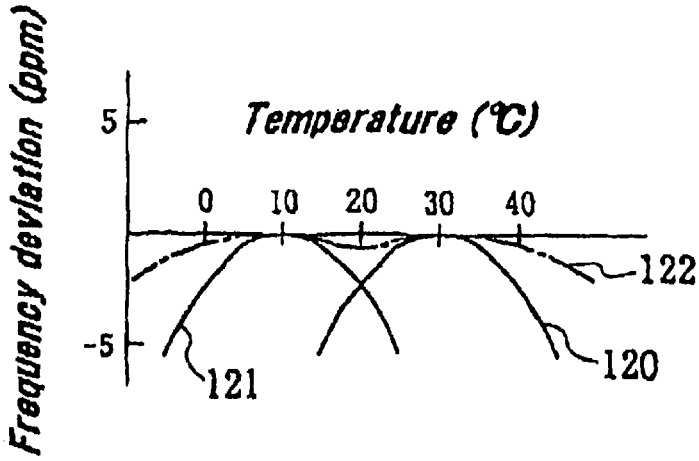
FIG. 10 is a diagram showing the frequency-temperature behaviour of embodiments of a resonator according to the present invention.

FIG. 10 shows an example of frequency temperature behaviour for an integrally formed flexural mode, tuning fork, quartz crystal resonator embodying the present invention. The quartz crystal resonator 101, shown in FIG. 8, exhibits a frequency-temperature behaviour 120, with a peak temperature point of about 30° C., while the resonator 102 shown in FIG. 8 has frequency temperature behaviour 121 with a peak temperature point of about 10° C. The compensated frequency-temperature behaviour for both quartz crystal resonators connected in parallel electrically is shown by the curve 122. The integrally formed embodiment of the quartz crystal tuning fork resonator, capable of vibrating in a flexural mode, according to the present invention, has the advantages of being capable of being fabricated in miniature and of demonstrating excellent frequency-temperature behaviour.

Embodiment 5

Figure 11:
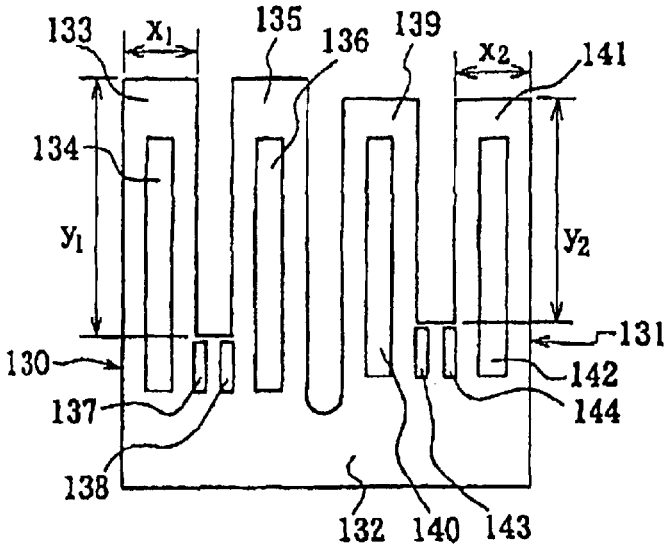
FIG. 11 is a plan view of an embodiment of a resonator according to the present invention, which has two quartz crystal resonators, capable of vibrating in a flexural mode, connected at the base of each tuning fork, with the tuning fork of each resonator having different-tuning fork tine dimensional ratios.

FIG. 11 shows a plan view of a further embodiment of a quartz crystal, tuning fork resonator, capable of vibrating in a flexural mode, according to the present invention. As shown in FIG. 8, two quartz crystal tuning fork resonators are generally constructed having an angle $\phi$ between them in order to change the peak temperature point of the resonators. In the embodiment of the present invention shown in FIG. 11, however, it is possible to change the peak temperature point of the quartz crystal tuning fork resonators, capable of vibrating in a flexural mode, by changing at least one dimension of the tuning fork tines, including the width $x_1$, and length $y_1$ of the first tuning fork tine, and the width $x_2$ and length $y_2$ of the second tuning fork tine. A peak temperature point of the frequency-temperature behaviour for a quartz crystal tuning fork resonator, capable of vibrating in a flexural mode, depends upon the width-to-length ratio (x/y) of either the first tuning fork tine ($x_1/y_1$) or the second tuning fork tine ($x_2/y_2$), or both.

Accordingly, complex quartz crystal tuning fork resonators, capable of vibrating in a flexural mode, that are fabricated from a plurality of individual quartz crystal tuning fork resonators, each resonator individually being capable of vibrating in a flexural mode, and with each individual resonator having a different peak temperature point, are obtained by changing the width- to- length ratio of at least one tuning fork tine of at least one of the individual quartz crystal tuning fork resonators. As a result, the frequency temperature-behaviour as shown in FIG. 10 is obtained. More particularly, a resonator having a shape as shown in FIG. 11, is provided by quartz crystal tuning fork resonators 130 and 131, capable of vibrating in a flexural mode, which are connected and formed integrally at their tuning fork base 132. The resonators are arranged in parallel in a length-wise direction. The tuning fork tines 133, 135 and the tuning fork base of quartz crystal tuning fork resonator 130 have grooves 134, 136 and grooves 137, 138, respectively. The grooves 134 and 136 are constructed within the tuning fork tines 133 and 135, and extend to the tuning fork base of the resonator 130.

Similarly, the tuning fork tines 139, 141 and the tuning fork base of quartz crystal tuning fork resonator 131 have grooves 140, 142 and grooves 143, 144, respectively. Grooves 140 and 142 extend to the tuning fork base of resonator 131. Because both quartz crystal tuning fork resonators 130, 131, capable of vibrating in a flexural mode, are connected and formed integrally at each tuning fork base 132, the miniaturization of the resonator is possible, and two quartz crystal tuning fork resonators with different frequency-temperature behaviour are obtained. In addition, an integrally formed multiple quartz crystal tuning fork resonator with excellent frequency-temperature characteristics is realized by electrically connecting the two individual resonator components in parallel.

Embodiment 6

Figure 12:
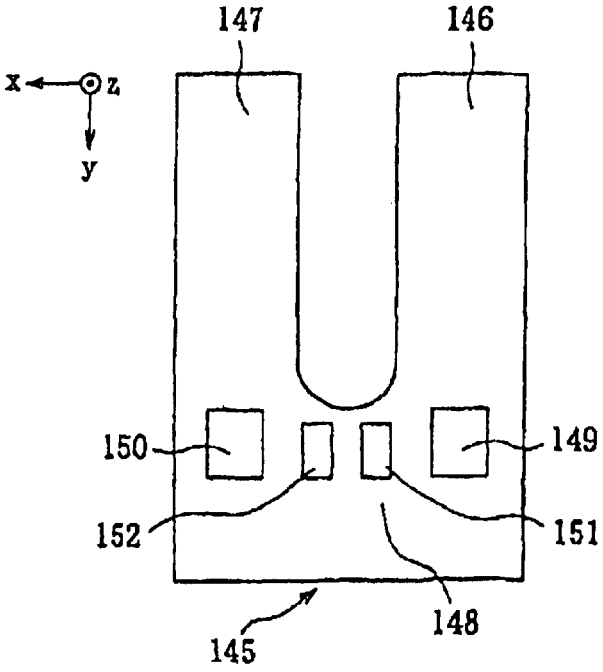
FIG. 12 is a plan view of one embodiment of a quartz crystal tuning fork resonator, capable of vibrating in a flexural mode, according to the present invention.

FIG. 12 shows a plan view of still another embodiment of a quartz crystal tuning fork resonator, capable of vibrating in a flexural mode, according to the present invention. The quartz crystal tuning fork resonator 145, capable of vibrating in a flexural mode, includes first and second tuning fork tines 146, 147, and tuning fork base 148. The tuning fork base has an obverse face and a reverse face. One end of each of the tuning fork tines 146 and 147 is connected to the tuning fork base 148. In this embodiment, a plurality of grooves 149, 150, 151 and 152 are constructed on the obverse face of the tuning fork base 148, and not on the tuning fork tines themselves. Additionally, a plurality of grooves is similarly constructed on the reverse face of tuning fork base 148.

The grooves 149 and 150 are each constructed on the obverse face of the tuning fork base 148 at a portion thereof where the end of one of the tuning fork tines 146 and 147 is connected to the tuning fork base 148, respectively. The grooves 151 and 152 are constructed on the obverse face of the tuning fork base between grooves 149 and 150. The electrode disposition and the construction is not shown in FIG. 12, but is similar to that already explained in detail with regard to FIG. 6, above. By so constructing the grooves and the electrodes, a quartz crystal tuning fork resonator, capable of vibrating in a flexural mode, is obtained, having a small series resistance $R_1$ and a high quality factor Q, because a large distortion occurs at the tuning fork base.

Embodiment 7

Figure 13:
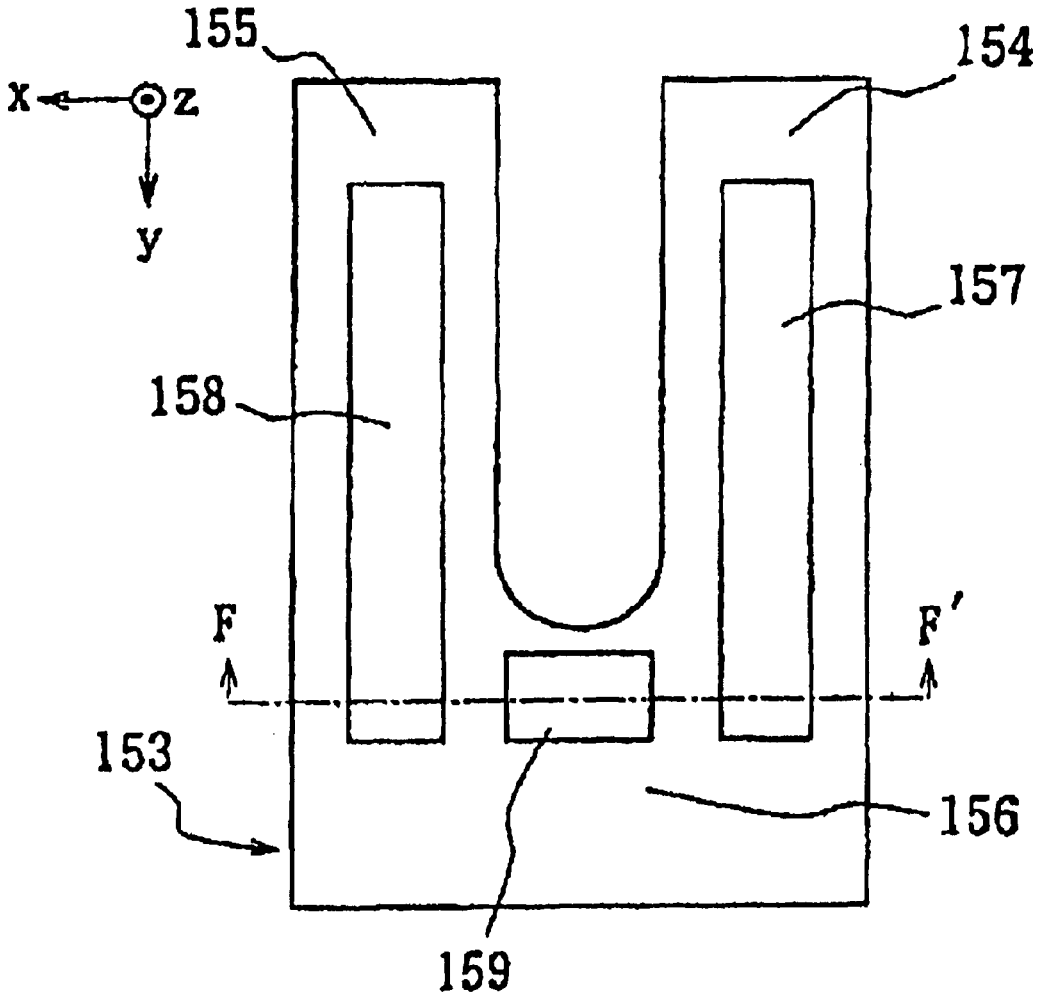
FIG. 13 is a plan view of another embodiment of a quartz crystal tuning fork resonator, capable of vibrating in a flexural mode, according to the present invention.

FIG. 13 shows a plan view of yet another embodiment of a quartz crystal tuning fork resonator 153, capable of vibrating in a flexural mode, according to the present invention. The quartz crystal tuning fork resonator 153 includes first and second tuning fork tines 154, 155, and tuning fork base 156. The tuning fork tines 154 and 155 have grooves 157 and 158, which extend to the tuning fork base 156. In addition, a groove 159 is constructed on the tuning fork base 156 between the grooves 157 and 158.

Figure 14:
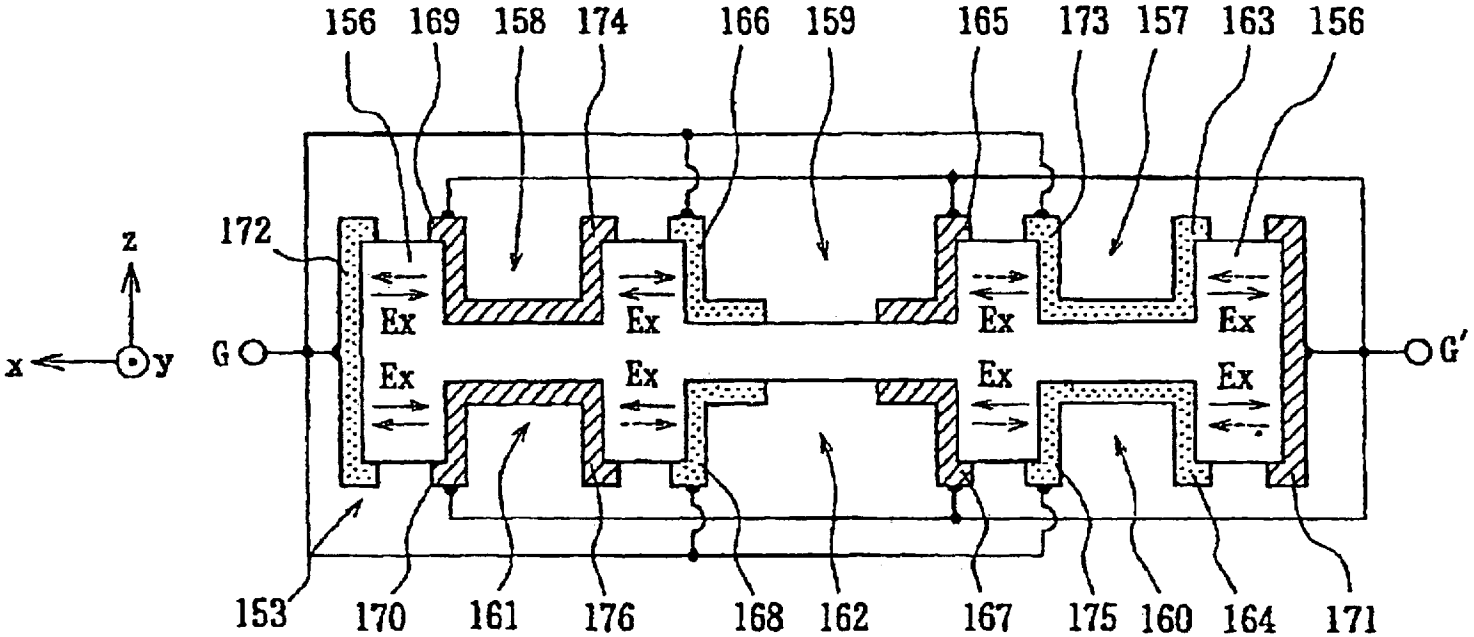
FIG. 14 is a cross-sectional view through F—F' of the tuning fork base of FIG. 13, showing the electrode construction.

FIG. 14 shows a cross-sectional view through F-F' of FIG. 13, of the tuning fork base 156, of the quartz crystal tuning fork resonator 153, capable of vibrating in a flexural mode, according to FIG. 13. FIG. 14 shows details of the shape and the electrode construction, in cross-sectional view, of the tuning fork base 156 for the quartz crystal tuning fork resonator 153 of FIG. 13. As shown in FIG. 14, the quartz crystal tuning fork resonator 153 has grooves 157 and 160, opposite to one another, constructed within the obverse and the reverse faces of the tuning fork base 156, respectively, where tuning fork tine 154 is connected to tuning fork base 156. Similarly, the resonator 153 has grooves 158 and 161, opposite to one another, constructed within the obverse and the reverse faces of the tuning fork base 156, respectively, where tuning fork tine 155 is connected to tuning fork base 156. Additionally, groove 159 is constructed between groove 157 and groove 158, and groove 162 is constructed opposite groove 159, and between groove 160 and groove 161.

Grooves 157, 160 have electrodes 163, 164 of the same electrical polarity; respectively; grooves 159, 162 have electrodes 165, 166 and electrodes 167, 168; grooves 158, 161 have electrodes 169, 170 of the same electrical polarity, and both sides of the tuning fork base 156 have electrodes 171, 172 of opposite electrical polarity. The electrodes are connected in such a way that electrodes disposed opposite the sides of the grooves 157, 158, 159, 160, 161, 162 have different electrical polarities. Thus, the electrodes 165, 167, 169, 170, 171 are all the same electrical polarity while electrodes 163, 164, 166, 168, 172 are of the opposite electrical polarity. The electrodes are electrically connected so that the resonator has two electrode terminals G–G'.

Groove 159 has electrode 165 and electrode 166, each of opposite electrical polarity; similarly, groove 162 has electrode 167 and electrode 168, each of opposite electrical polarity. The electrodes opposite the electrodes on the sides of the adjoining grooves in the x-axis direction are of opposite electrical polarity. Therefore, for this embodiment, electrode 173, which is disposed on the side of groove 157, and electrode 165, which is opposite to electrode 173 and is disposed on the side of groove 159, are of opposite electrical polarities. Similarly, electrodes 175 and 167 are of opposite electrical polarity; electrodes 166 and 174 are also of opposite electrical polarity; and electrodes 168 and 176 are of opposite electrical polarity. Electrode 163 and electrode 164, disposed inside the grooves 157 and 160, constructed opposite to one another, in the thickness (z-axis) direction of the tuning fork tines, are of the same electrical polarity. Likewise, electrode 169 and electrode 170, which are respectively disposed inside the grooves 158 and 161 constructed opposite to one another in the thickness (z-axis) direction of the tuning fork tines, are also of the same electrical polarity. Electrodes 163, 164, 169, 170, disposed respectively inside grooves 157, 160, 158, 161, and electrodes 171, 172, disposed on the sides of the tuning fork base 156, extend from tuning fork base 156 to tuning fork tines 154, 155.

When an alternating voltage is applied between the two electrode terminals G–G', an electric field Ex occurs alternately along the arrow directions shown by the solid and broken lines in FIG. 14. As a result, vibration of the quartz crystal tuning fork resonator in a flexural mode is generated in the inverse phase. Because the electric field $E_x$ occurs perpendicular to the electrodes, between the electrodes disposed on the sides of the grooves, the electric field $E_x$ becomes large, and because the tuning fork base 156 also has grooves 159, 162, with electrodes 165, 166, 167, 168, a markedly large distortion occurs at the tuning fork base, so that the quartz crystal tuning fork resonator vibrating in a flexural mode has a small series resistance $R_1$ and a high quality factor Q.

In the above-mentioned embodiments, the grooves are constructed on the tuning fork tines and/or the tuning fork base, however, still other embodiment of the present invention include holes instead of grooves or a combination of grooves and holes.

Embodiment 8

Figure 15:
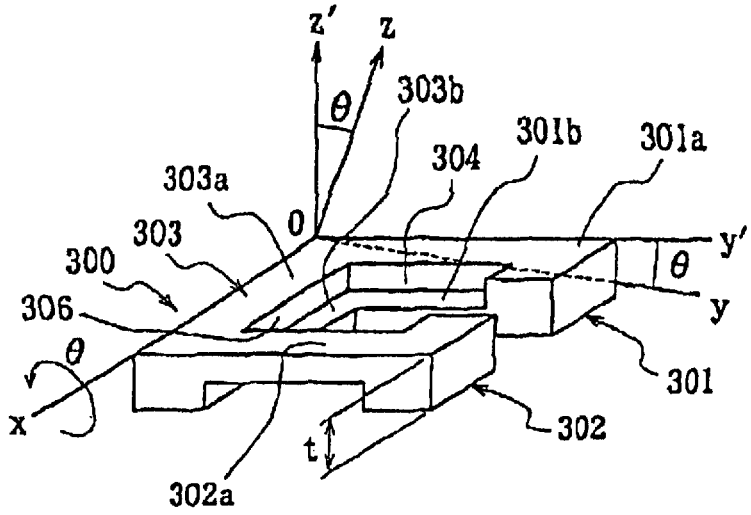
FIG. 15 is a general view of an embodiment of a quartz crystal tuning fork resonator, capable of vibrating in a flexural mode, according to the present invention, showing a reference coordinate system for the resonator.
Figure 16:
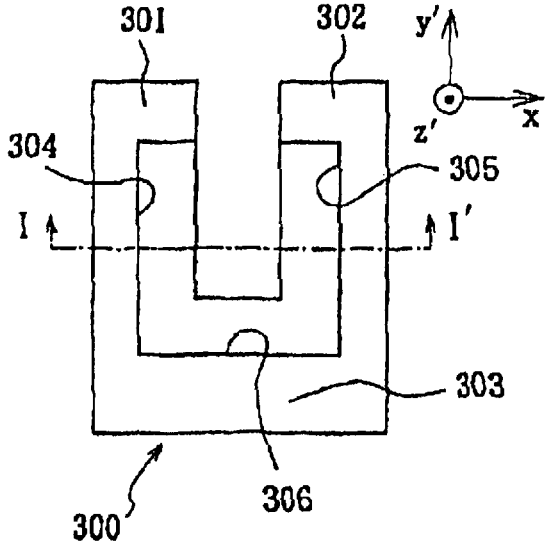
FIG. 16 is a plan view of the quartz crystal tuning fork resonator, capable of vibrating in a flexural mode, of FIG. 15.
Figure 17:
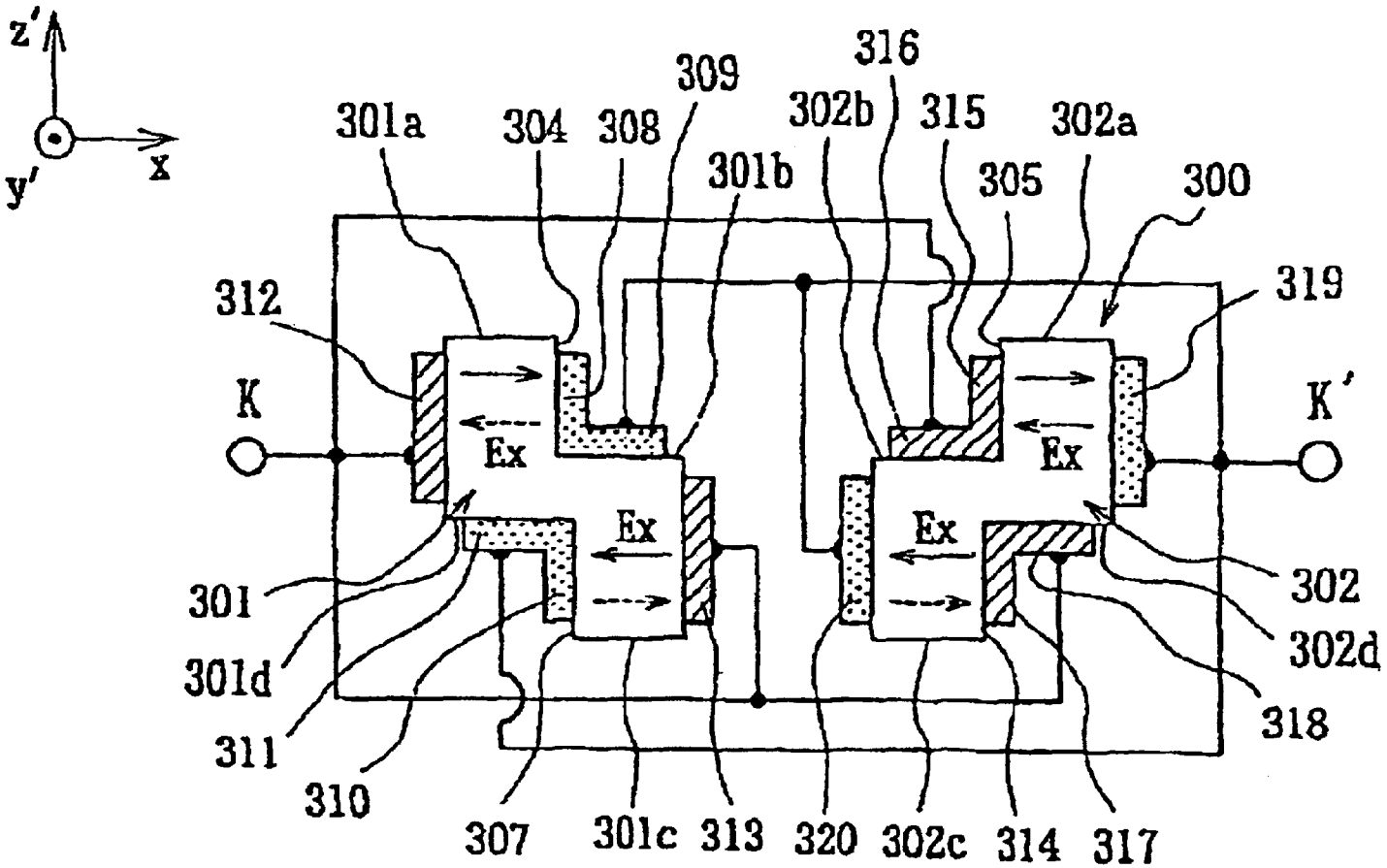
FIG. 17 is a cross-sectional view through I–I' of the tuning fork tines of the resonator of FIG. 16, showing the electrode construction.

FIG. 15 shows a general view of another embodiment of a quartz crystal tuning fork resonator 300, capable of vibrating in a flexural mode, according to the present invention, and its coordinate system. FIG. 16 is a plan view of the resonator 300 shown in FIG. 15, and FIG. 17 shows a cross-sectional view through I–I' of the tuning fork tines shown in FIG. 16. As shown in FIG. 15, the resonator 300 is formed from a quartz crystal wafer rotated about its x-axis and with a cut angle θ. In general, cut angle θ has a value of from 0° to about 10°. The y' and z' axes are new y and z-axes obtained after rotation about the x-axis. This quartz crystal tuning fork resonator 300, capable of vibrating in a flexural mode, includes first and second tuning fork tines 301, 302, attached to tuning fork base 303, and has thickness t. Tuning fork tine 301 has step difference portions, and the step difference portion 304 (at the inner side of upper surface portion 301a) is formed between upper surface portion 301a and medium surface portion 301b. The medium surface portion 301b and the step difference portion 304 extend to the tuning fork base 303.

Similar to tuning fork tine 301, a medium surface portion 302b and a step difference portion 305 are formed on the obverse face of tuning fork tine 302, as shown in FIG. 16 and FIG. 17. The upper surface portion 303a, the medium surface portion 303b, and the step difference portion 306 are formed on tuning fork base 303. As shown in FIG. 16, tuning fork tine 301 of resonator 300 has a step difference portion 304, while tuning fork tine 302 has a step difference portion 305. These step difference portions extend to the tuning fork base 303, and the step difference portions 304 and 305 are connected at the step difference portion 306 of the tuning fork base 303. In this embodiment the step difference portions of the tuning fork tines are constructed in series, however, alternative embodiments of the present invention include a plurality of step difference portions spaced along the length direction of the tuning fork tines.

As shown in FIG. 17, a structure similar to the obverse face of tuning fork tine 301 is also constructed on the reverse face. The step difference portion 307 is formed between the lower surface portion 301c and the medium surface portion 301d, with the step difference portion 307 extending to the tuning fork base 303. The step difference portion 304 of the obverse face is oriented towards the inside of tuning fork tine 301 and the step difference portion 307 of the reverse face is oriented towards the outside of tuning fork tine 301. Electrode 308 is disposed on the step difference portion 304 and electrode 309, which is connected to electrode 308, is disposed on the medium surface portion 301b. Electrode 310 is disposed on the step difference portion 307 and electrode 311, which is connected to electrode 310, is disposed on the medium surface portion 301d. Electrode 312 is disposed on the side of tuning fork tine 301, opposite to electrode 308, which is disposed on the step difference portion 304. Electrode 313 is disposed on the side of tuning fork tine 301, opposite to electrode 310, which is disposed on the step difference portion 307.

According to this arrangement of electrodes, an electric field Ex occurs perpendicularly between electrodes 308 and 312 and electrodes 310 and 313. Similarly, tuning fork tine 302 also has the step difference and corresponding electrodes of left and right symmetry to tuning fork tine 301. The step difference portions 305, 314, the upper surface portion 302a, the medium surface portion 302b, and the medium surface portion 302d, are constructed on both the obverse and the reverse faces of tuning fork tine 302. Electrode 315 is disposed on the step difference portion 305 and electrode 316, which is electrically connected to electrode 315, is disposed on the medium surface portion 302b. Electrode 317 is disposed on the step difference portion 314 and electrode 318, which is electrically connected to electrode 317, is disposed on the medium surface portion 302d. Electrode 319 is disposed on the side of tuning fork tine 302, opposite electrode 315, and electrode 320 is disposed on the side of tuning fork tine 302, opposite electrode 317. The first set of electrodes 308, 309, 310, 311, 319 and 320 have the same electrical polarity and the second set of electrodes 312, 313, 315, 316, 317 and 318 have the same electrical polarity, which is opposite to the polarity of the first set of electrodes. As a result, two electrode terminals K–K' are constructed.

When an alternating current (AC) voltage is applied between the electrode terminals K–K', an electric field $E_x$ occurs perpendicularly and alternately between the electrodes, as shown by the solid and broken arrow symbols in FIG. 17. A flexural mode vibration can be easily excited in the resonator, so that a quartz crystal tuning fork resonator vibrating in a flexural mode, and having a small series resistance R1 and a high quality factor Q, is obtained because the electromechanical transformation efficiency for the resonator becomes large.

Embodiment 9

Figure 18:
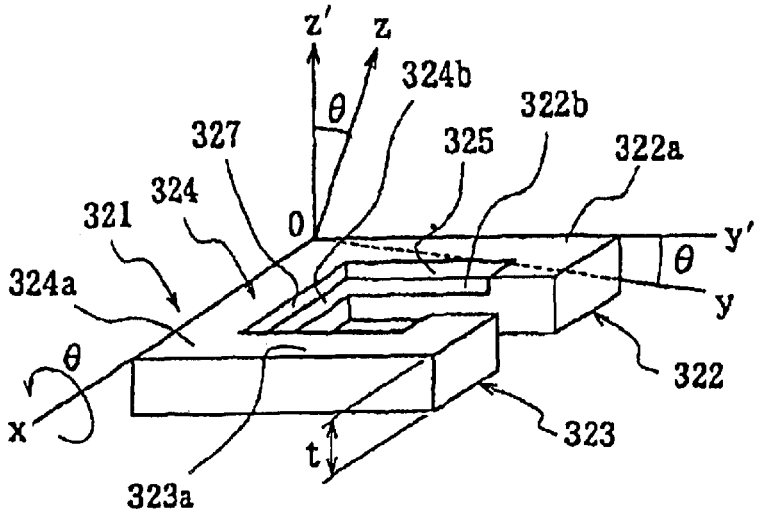
FIG. 18 is a general view of an embodiment of a quartz crystal tuning fork resonator, capable of vibrating in a flexural mode, according to the present invention, showing a reference coordinate system for the resonator.
Figure 19:
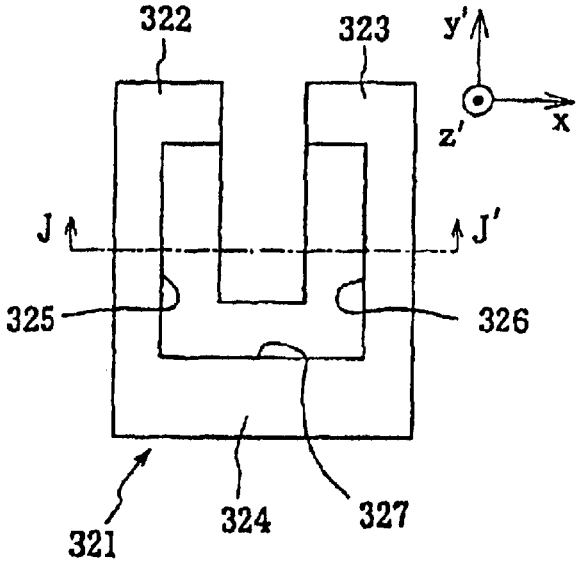
FIG. 19 is a plan view of the quartz crystal tuning fork resonator of FIG. 18.
Figure 20:
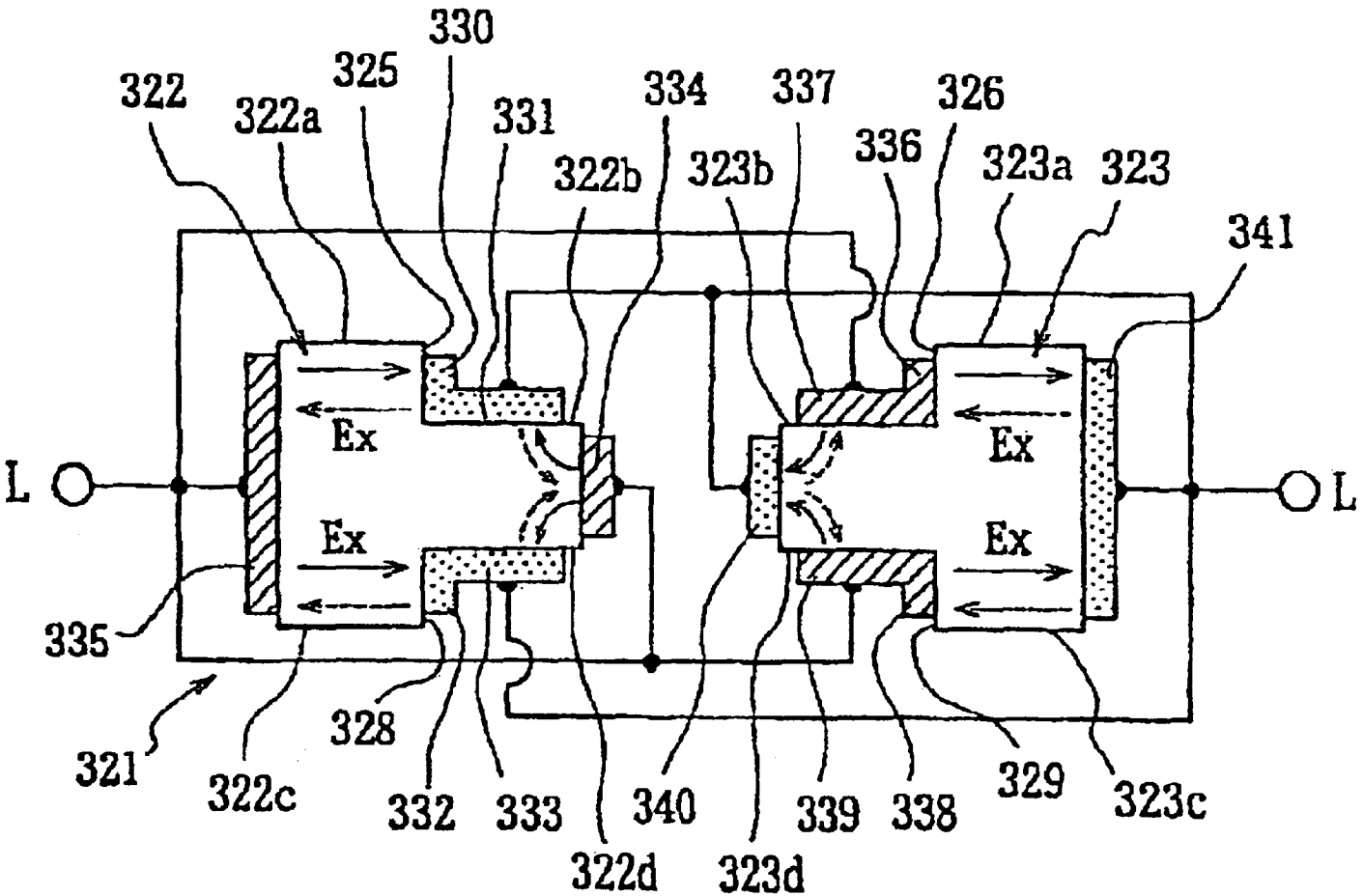
FIG. 20 is a cross-sectional view through J—J' of the tuning fork tines of the resonator of FIG. 19, showing the electrode construction.

FIG. 18 shows a general view of still another embodiment of a quartz crystal tuning fork resonator 321, capable of vibrating in a flexural mode, according to the present invention and its coordinate system. FIG. 19 is a plan view of the resonator 321 of FIG. 18, and FIG. 20 shows a cross-sectional view through J–J' of the tuning fork tines of FIG. 19. The coordinate system of this embodiment is the same as that shown in FIG. 15. A quartz crystal tuning fork resonator 321, capable of vibrating in a flexural mode, according to this embodiment, includes first and second tuning fork tines 322, 323, attached to tuning fork base 324. The tuning fork tines have a thickness t. Tuning fork tine 322 further has a step difference, as shown in FIG. 18 and FIG. 20. Upper surface portion 322a, medium portion 322b, 322d, step difference portion 325, 328, and lower surface portion 322c are formed on tuning fork tine 322. The medium surface portion 322b, 322d, and the step difference portion 325, 328 extend to the tuning fork base 324, which has an obverse face that is shaped to the upper surface portion 324a, the medium surface portion 324b and the step difference portion 327, and which has a reverse face with the same shape as the obverse face (not shown in FIGS. 18 and 19).

Similarly, upper surface 323a, medium portions 323b, 323d, step difference portions 326, 329, and lower surface portion 323c are formed on tuning fork tine 323. The medium surface portions 323b, 323d and the step difference portions 326, 329 extend to the tuning fork base 324 in a manner similar to tuning fork tine 322. As shown in FIGS. 19 and 20, the tuning fork tines 322 and 323 have the step difference portions 325 and 326, which extend to the tuning fork base 324, and connect at the step difference portion 327. The step difference portions 325 and 328 are constructed at the obverse and the reverse faces, respectively, of tuning fork tine 322, and the step difference portions 326 and 329 are constructed on the obverse and the reverse faces, respectively, of tuning fork tine 323. In this embodiment, the step difference portions 325, 328 and 326, 329 face the inside of the tuning fork tines 322 and 323. The same effect is obtained when the step difference portions 325, 328 and 326, 329 face the outside of the tuning fork tines 322 and 323.

Electrode 330 is disposed on step difference portion 325 and electrode 331, which is connected to electrode 330, is disposed on medium surface portion 322b. Electrode 332 is also disposed on step difference portion 328, and electrode 333, which is connected to electrode 332, is disposed on the medium surface portion 322d. Electrodes 334, 335 are disposed on both sides of tuning fork tine 322. Electrode 335 is disposed opposite electrodes 330 and 332, which are of opposite electrical polarity to electrode 335. Similarly, tuning fork tine 323 also has the step difference and electrodes of left and right symmetry to tuning fork tine 322.

Tuning fork tine 323 has difference portions 326, 329, upper surface portion 323a, medium surface portions 323b, 323d, and lower surface portion 323c. Step difference portion 326 has electrode 336, which is connected to electrode 337, which is disposed on the medium surface portion 323b. Step difference portion 329 has electrode 338, which is connected to electrode 339, which is disposed on the medium surface portion 323d. Electrodes 340, 341 are disposed on both sides of tuning fork tine 323. Electrode 341 is disposed opposite to electrodes 336 and 338, which are of opposite electrical polarity to electrode 341. As shown in detail in FIG. 20, the first set of electrodes 330, 331, 332, 333, 340 and 341 have the same electrical polarity, while the second set of electrodes 334, 335, 336, 337, 338 and 339 have the same electrical polarity, which is opposite to the electrical polarity to the first set of electrodes. The electrodes are connected to form two electrode terminals L–L'.

When an alternating current (AC) voltage is applied between the two electrode terminals L–L', an electric field $E_x$ occurs, oriented perpendicular to and alternately between the electrodes, as shown by the solid and broken arrow symbols in FIG. 20, and a flexural mode vibration is easily excited, so that a quartz crystal tuning fork resonator vibrating in a flexural mode is obtained. The resonator has a small series resistance $R_1$ and a high quality factor Q because the electromechanical transformation efficiency for the resonator becomes large. In this embodiment, tuning fork tines 322 and 323 have medium surface portions 322b, 322d, 323b and 323d on the inside of the tines, however, the same effect as that of this shape is obtained when the medium surface portions are constructed on the outside of tuning fork tines 322 and 323.

Embodiment 10

Figure 21:
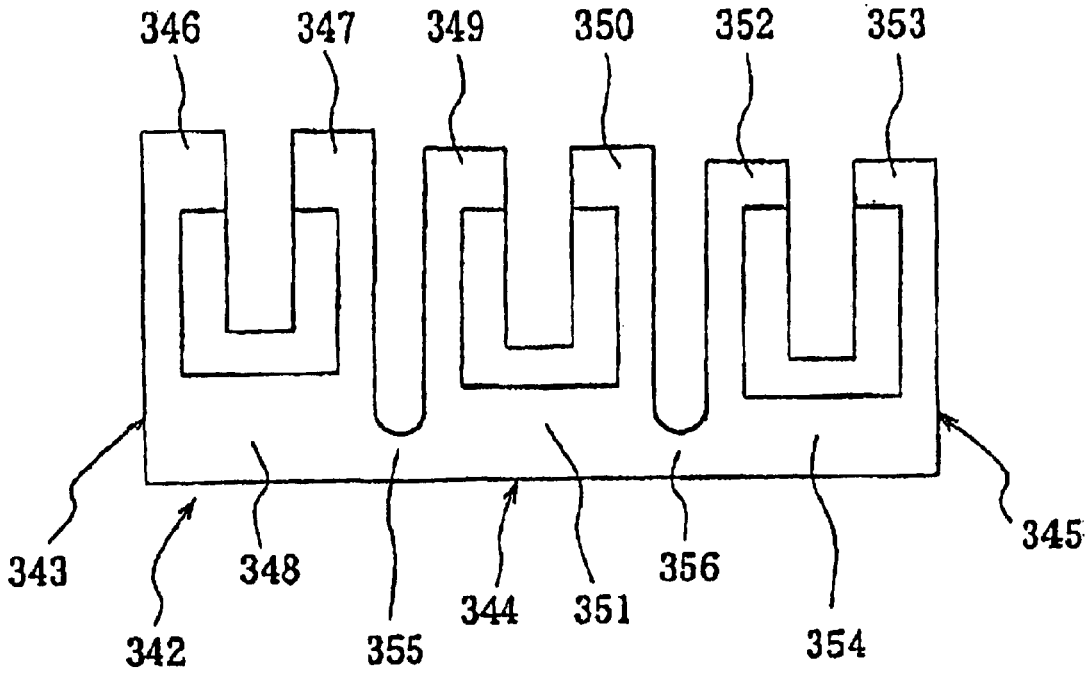
FIG. 21 is a plan view of an embodiment of a quartz crystal tuning fork resonator, capable of operating in a flexural mode, according to the present invention, having three resonators.

FIG. 21 shows a plan view of yet still another embodiment of a quartz crystal tuning fork resonator 342, capable of vibrating in a flexural mode, according to the present invention. In this embodiment three quartz crystal tuning fork resonators 343, 344, 345, each individually capable of vibrating in a flexural mode, are connected at the tuning fork bases and are integrally formed by an etching or mechanical process. As shown in FIG. 21, each resonator 343, 344 and 345, uses the step difference embodiment of quartz crystal tuning fork resonators 300 and 321. The first resonator 343 includes tuning fork tines 346, 347, attached to tuning fork base 348; the second resonator 344 includes tuning fork tines 349, 350, attached to tuning fork base 351; and the third resonator 345 includes tuning fork tines 352, 353, attached to tuning fork base 354. The first resonator 343 and the second resonator 344 are integrally formed through base portion 355 of tuning fork bases 348 and 351.

Similarly, the second resonator 344 and the third resonator 345 are integrally formed through base portion 356 of tuning fork bases 351 and 354. These resonators 343, 344 and 345 are designed so as to each have a different ratio of width to length of their tuning fork tines. As a result of this, the three individual quartz crystal tuning fork resonators 343, 344 and 345, capable of vibrating in a flexural mode, are integrally formed and have different frequency-temperature behaviour characteristics, yet constitute a single piece integrated quartz crystal resonator.

Furthermore, as described in detail hereinabove with respect to the embodiments shown in FIGS. 8–11, an improvement of the frequency-temperature behaviour characteristics of this embodiment may be obtained by electrically connecting these resonators 343, 344 and 345 in parallel. Although this embodiment illustrates the formation of an integrated quartz crystal tuning fork resonator, capable of vibrating in a flexural mode, having, three individual component quartz crystal tuning fork resonators, there is nothing that limits the integrated resonator to three individual component resonators, and an integrated resonator having more than three individual component resonators can also readily be fabricated.

Figure 22:
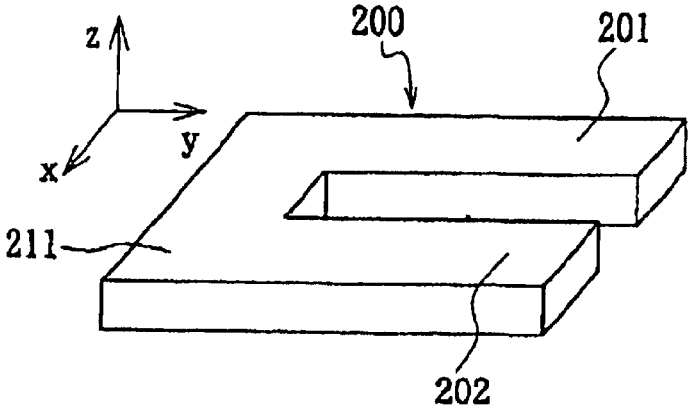
FIG. 22 PRIOR ART
FIG. 22 is a general view of the conventional flexural mode, tuning fork, quartz crystal resonator.
Figure 23:
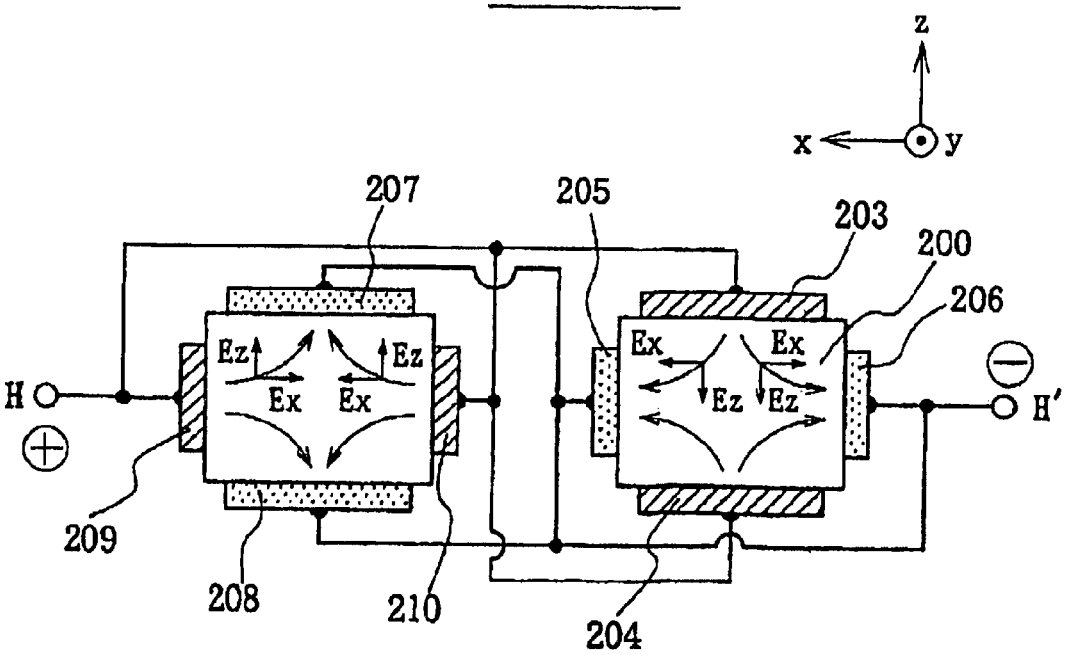
FIG. 23 PRIOR ART
FIG. 23 is a cross-sectional view of the tuning fork tines of FIG. 22 and illustrating electrode construction.

Furthermore, in such embodiments, although a plurality of individual component quartz crystal tuning fork resonators, each capable of vibrating in a flexural mode, and having the same shape, are used to improve the frequency-temperature behaviour characteristics of the integrated resonator, the frequency-temperature behaviour characteristics of such a resonator can also be improved by forming an integrated resonator utilizing a combination of different individual component resonators, such as, for example, (1) by utilizing a combination of quartz crystal tuning fork resonators with grooves as shown in FIGS. 1, 5, 12 and 13 and a quartz crystal tuning fork resonator with step difference as shown in FIGS. 15 and 18; (2) by a combination of resonators as shown in FIGS. 1, 5, 12 and 13; (3) by a combination of resonators as shown in FIGS. 15 and 18; (4) by a combination of resonators as shown in FIGS. 1, 5, 12, 13, 15 and 18 with a conventional resonator as shown in FIGS. 22 and 23.

In other words, an improvement of the frequency-temperature behaviour characteristics of an integrated quartz crystal tuning fork resonator, capable of vibrating in a flexural mode, can be accomplished by employing an embodiment of a quartz crystal tuning fork resonator according to the present invention, and electrically connecting it in parallel to another resonator.

Embodiments of the quartz crystal tuning fork resonators, capable of vibrating in a flexural mode, according to the present invention also utilize two methods of electrode disposition, the choice of which determines the vibration mode of the tuning fork tines. According to a first method (1) electrodes are disposed so that each quartz crystal tuning fork resonator, capable of vibrating in a flexural mode, consists of a plurality of individual resonators that are connected and integrally formed at their tuning fork bases, such that the resonators all vibrate in the same vibration mode; and according to a second method (2) electrodes are disposed so that a quartz crystal tuning fork resonator, capable of vibrating in a flexural mode, and including a plurality of individual component resonators that are connected and integrally formed at their tuning fork bases, such that the individual component resonators vibrate in different modes.

Each quartz crystal tuning fork resonator, capable of vibrating in a flexural mode, according to these embodiments, is connected and is integrally formed side by side as shown in FIGS. 8, 11 and 21. However, the present invention is not limited to flexural mode, tuning fork, quartz crystal resonator connected and formed integrally side by side, but includes the connection and integrated formation of any shapes at the tuning fork bases.

The embodiments of individual quartz crystal tuning fork resonators, capable of vibrating in a flexural mode, according to the present invention, have two tuning fork tines, however, other alternative embodiments can be fabricated having a greater plurality of tuning fork tines. Still other alternative embodiments of the present invention also include quartz crystal tuning fork resonators, capable of vibrating in a flexural mode, having more than three individual resonator components, which are connected and integrally formed at the tuning fork bases. Yet still other alternative embodiments of quartz crystal tuning fork resonators, capable of vibrating in a flexural mode, according to the present invention, include integrated embodiments including a plurality of individual resonators wherein the individual component resonators are connected and integrally formed at each tuning fork base, and wherein each component resonator has a different shape and a different electrode configuration.

The present invention includes those embodiments of quartz crystal tuning fork resonators, capable of vibrating in a flexural mode, having two individual component quartz crystal tuning fork resonators, each capable of vibrating in a flexural mode, wherein the tuning fork bases are connected and integrally formed at an angle $\phi$ between the tuning fork bases, as has been described and shown in FIG. 8, hereinabove, as well still further including other alternative embodiments of quartz crystal tuning fork resonators, capable of vibrating in a flexural mode, wherein the resonators are substantially the same as those resonators according to the present invention having an angle $\phi$ between the base portions of the integrally formed individual component resonators, but wherein the plurality of individual component resonators are formed in parallel and at least one of the plurality of component resonators is designed and formed so that at least two tuning fork tines are inwardly oriented towards at an angle $\phi$, or, alternatively, are outwardly oriented at an angle $\phi$.

The following lists some of the results and advantages that are obtained using the quartz crystal tuning fork resonators, capable of vibrating in a flexural mode, according to the present invention, having the resonator shapes and electrode configurations as described hereinabove:

(1) Because the grooves are constructed in such a way so as to include a portion of the central linear region of the tuning fork tines, an electric field occurs perpendicular to the electrodes, so that the quartz crystal tuning fork resonator, when vibrating in a flexural mode, has a small series resistance $R_1$ and a high quality factor Q because the electromechanical transformation efficiency is large.

(2) Even when miniaturized, the quartz crystal tuning fork resonator, vibrating in a flexural mode, still has a very small series resistance $R_1$.

(3) A miniaturized integrated quartz crystal tuning fork resonator, capable of vibrating in a flexural mode, and including two individual quartz crystal tuning fork resonators integrally formed, is realized by fabricating the resonator using an etching process, and has the two resonators being electrically connected in parallel, resulting in an integrated resonator having excellent frequency-temperature behaviour characteristics.

(4) A low price quartz crystal tuning fork resonator, capable of vibrating in a flexural mode, is realizable because the resonator is integrally formed using an etching process, which enables the formation of an integrated resonator including many individual resonators, fabricated on a single piece of quartz wafer.

(5) Because prior art quartz crystal resonators are generally of the tuning fork type, it is easy to mount a quartz crystal tuning fork resonator according to the present invention on two lead wires or a pedestal, thereby resulting in a decrease in energy losses at the mounting, caused by vibration of the tuning fork tines, and thereby also rendering the resonators of the present invention highly mechanically shock resistant.

(6) Because there are a plurality of grooves of opposite electrical polarity on the tuning fork base and the electrodes that are disposed opposite to the sides of adjoining grooves, the distortion at the tuning fork base is large, resulting in a quartz crystal tuning fork resonator, capable of vibrating in a flexural mode, and having a small series resistance $R_1$ and a high quality factor Q, even when miniaturized.

(7) Because grooves are constructed so as to include the central linear region of the tuning fork tines, with electrodes being positioned on the grooves, and with the grooves extending to the tuning fork base, the quantity of distortion at the tuning fork base is large, resulting in a quartz crystal tuning fork resonator, capable of vibrating in a flexural mode, and having a small series resistance $R_1$ and a high quality factor Q, because there is also a high electromechanical transformation efficiency.

(8) Because, in certain embodiments, electrodes are disposed on step difference portions constructed at obverse and reverse faces of the tuning fork tines, in their width direction, and because sides of the tuning fork tines opposite to electrodes have an opposite electrical polarity to those electrodes, the electromechanical transformation efficiency of the resonator is very large, thereby resulting in a quartz crystal tuning fork resonator, capable of vibrating in a flexural mode, and having a small series resistance $R_1$ and a high quality factor Q.

(9) Narrow width tuning fork tines are possible in certain embodiments of the resonators according to the present invention, while still maintaining a sufficiently large electro-mechanical transformation efficiency, by constructing step differences on the tuning fork tines.

(10) Because a plurality of quartz crystal tuning fork resonators are integrally formed and are electrically connected in parallel according to certain embodiments of the present invention, the compound series resistance $R_1$ for the compound, integrated resonator is small. For example, when a compound, integrated quartz crystal tuning fork resonator according to the present invention is fabricated from two individual resonators, each having the same series resistance $R_1$, the resulting integrated resonator has only half the total series resistance $R_1$. Thus, the compound series resistance $R_1$ of a compound, integrated resonator can be decreased even more by increasing the number of individual resonators which are integrally formed as part of the compound, integrated resonator.

(11) Because the compound, integrated quartz crystal tuning fork resonators according to certain embodiments of the present invention are formed integrally, and are electrically connected in parallel, the resonator can continue to function even if one of the individual resonators that from the integrated resonator should break or become inoperative, such as due to the component receiving a severe mechanical shock.

The quartz crystal tuning fork resonators, capable of vibrating in a flexural mode, according to the present invention, and having the novel shapes and novel electrode configurations described hereinabove demonstrate the foregoing results and advantages over conventional quartz crystal tuning fork resonators previously known in the art. In addition, although the present invention has been described and illustrated with reference to those preferred embodiments thereof disclosed herein, it will be understood by those skilled in the art that additional embodiments of quartz crystal tuning fork resonators, capable of vibrating in a flexural mode, and having still other shapes and electrode configurations are possible and can be made without departing from the spirit and scope of the present invention.

What is claimed is:

[1. A quartz crystal tuning fork resonator capable of vibrating in a flexural mode, the quartz crystal tuning fork resonator comprising:

a plurality of quartz crystal tuning fork tines for undergoing vibration in an inverse phase, each of the quartz crystal tuning fork tines having a first main surface and a second main surface opposite the first main surface, each of the first and second main surfaces having a central linear portion;

a quartz crystal tuning fork base to which the quartz crystal tuning fork tines are attached; and at least one groove formed in the central linear portion of each of the first and second main surfaces of each of the quartz crystal tuning fork tines, a width of the groove in the central linear portion of one of the first and second main surfaces of each of the quartz crystal tuning fork tines being greater than or equal to a distance in the width direction of the groove measured from an outer edge of the groove to an outer edge of the tuning fork tine.]

[2. A quartz crystal tuning fork resonator capable of vibrating in a flexural mode, the quartz crystal tuning fork resonator comprising:

a plurality of quartz crystal tuning fork tines each having a plurality of stepped portions;

a quartz crystal tuning fork base to which the quartz crystal tuning fork tines are attached;

at least one first electrode disposed on each of two of the stepped portions of each of the quartz crystal tuning fork tines; and at least one second electrode disposed on a side of each of the quartz crystal tuning fork tines, the second electrode of each of the quartz crystal tuning fork tines having an electrical polarity opposite to an electrical polarity of the first electrode of each of the quartz crystal tuning fork tines.]

[3. An integrated quartz crystal tuning fork resonator for undergoing vibration in a flexural mode, the integrated quartz crystal tuning fork comprising:

a plurality of individual quartz crystal tuning fork resonators each capable of vibrating in a flexural mode, the plurality of individual quartz crystal tuning fork resonators being selected from the group consisting of:

(A) a quartz crystal tuning fork resonator having a plurality of quartz crystal tuning fork tines each having sides and a central linear portion, a quartz crystal tuning fork base to which the quartz crystal tuning fork tines are attached, at least one groove formed in the central linear portion of each of the quartz crystal tuning fork tines, at least one first electrode disposed in the at least one groove of each of the quartz crystal tuning fork tines, and at least one second electrode disposed on a side of each of the quartz crystal tuning fork tines, the second electrode of each of the quartz crystal tuning fork tines having an electrical polarity opposite to an electrical polarity of the first electrode of each of the quartz crystal tuning fork tines;

(B) a quartz crystal tuning fork resonator having a plurality of quartz crystal tuning fork tines, a quartz crystal tuning fork base to which the quartz crystal tuning fork tines are attached, a plurality of grooves formed in the quartz crystal tuning fork base, and at least one electrode disposed in each of the grooves;

(C) a quartz crystal tuning fork resonator having a plurality of quartz crystal tuning fork tines each having a plurality of stepped portions, a quartz crystal tuning fork base to which the quartz crystal tuning fork tines are attached, at least one first electrode disposed on each of two of the stepped portions of each of the quartz crystal tuning fork tines portions, at least one second electrode disposed on a side of each of the quartz crystal tuning fork tines, the second electrode of each of the quartz crystal tuning fork tines having an electrical polarity opposite to an electrical polarity of the first electrode of each of the quartz crystal tuning fork tines; and (D) a combination of individual resonators according to at least two of (A), (B) and (C).]

[4. A quartz crystal tuning fork resonator according to claim 1; wherein the plurality of quartz crystal tuning fork tines comprises a first quartz crystal tuning fork tine and a second quartz crystal tuning fork tine; and wherein the grooves in the first and second main surfaces of each of the first and second quartz crystal tuning fork tines are disposed opposite each other in a thickness direction of the first and second quartz crystal tuning fork tines.]

[5. A quartz crystal tuning fork resonator according to claim 4; wherein each of the first and second quartz crystal tuning fork tines has side surfaces; and further comprising a plurality of first electrodes each disposed in a respective groove of the first and second quartz crystal tuning fork tines, and a plurality of second electrodes each disposed on a respective side surface of each of the first and second quartz crystal tuning fork tines, the second electrodes of each of the first and second quartz crystal tuning fork tines having an electrical polarity opposite to an electrical polarity of the first electrodes of each of the quartz crystal tuning fork tines.]

[6. A quartz crystal tuning fork resonator according to claim 5; wherein the first electrode disposed in one of the grooves of the first quartz crystal tuning fork tine is connected to the second electrode disposed on one of the side surfaces of the second quartz crystal tuning fork tine such that the first electrode of the first quartz crystal tuning fork tine and the second electrode of the second quartz crystal tuning fork tine define a first electrode terminal; and wherein the second electrode disposed on one of the side surfaces of the first quartz crystal tuning fork tine is connected to the first electrode disposed in one of the grooves of the second quartz crystal tuning fork tine such that the second electrode of the first quartz crystal tuning fork tine and the first electrode of the second quartz crystal tuning fork tine define a second electrode terminal.]

[7. A quartz crystal tuning fork resonator according to claim 6; wherein two of the side surfaces of each of the first and second quartz crystal tuning fork tines comprises an inner side surface and an outer side surface opposite the inner side surface; wherein when a direct current voltage is applied between the first and second electrode terminals, a direction of an inner electric field generated between the second electrode disposed on the inner side of the first quartz crystal tuning fork tine and the first electrode disposed in one of the grooves opposite to the second electrode disposed on the inner side of the first quartz crystal tuning fork tine is the same as a direction of an inner electric field generated between the second electrode disposed on the inner side of the second quartz crystal tuning fork tine and the first electrode disposed in one of the grooves opposite to the second electrode disposed on the inner side of the second quartz crystal tuning fork tine, and a direction of an outer electric field generated between a second electrode disposed on the outer side of the first quartz crystal tuning fork tine and the first electrode disposed in one of the grooves opposite to the second electrode disposed on the outer side of the first quartz crystal tuning fork tine is the same as a direction of an outer electric field generated between the second electrode disposed on the outer side of the second quartz crystal tuning fork tine and the first electrode disposed in one of the grooves opposite to the second electrode disposed on the outer side of the second quartz crystal tuning fork tine, the direction of each of the inner electric fields being opposite to the direction of each of the outer electric fields.]

[8. A quartz crystal tuning fork resonator according to claim 7; wherein the directions of the inner and outer electric fields of the first and second quartz crystal tuning fork tines are generally along an x-axis direction of the quartz crystal tuning fork resonator.]

[9. A quartz crystal tuning fork resonator according to claim 8; wherein no electric field is generated between first electrodes disposed in opposite grooves of the first and second quartz crystal tuning fork tines when the direct current voltage is applied between the first and second electrode terminals.]

[10. A quartz crystal tuning fork resonator according to claim 9; wherein the inner and outer sides of the first and second quartz crystal tuning fork tines undergo simultaneous deformation in opposite directions along a longitudinal axis of the first and second quartz crystal tuning fork tines.]

[11. A quartz crystal tuning fork resonator according to claim 10; wherein when an alternating current voltage is applied between the first and second electrode terminals, the first and second quartz crystal tuning fork undergo vibration in a flexural mode of an inverse phase.]

[12. A quartz crystal tuning fork resonator according to claim 2; wherein the quartz crystal tuning fork tines comprise first and second quartz crystal tuning fork tines each having a first main surface and a second main surface opposite the first main surface, each of the first and second main surfaces having one of the two stepped portions; wherein the first electrodes disposed in the two stepped portions of the first quartz crystal tuning fork tine are connected to the second electrode disposed on the side of the second quartz crystal tuning fork tine to define a first electrode terminal; and wherein the second electrode disposed on the side of the first quartz crystal tuning fork tine is connected to the first electrodes disposed in the two stepped portions of the second quartz crystal tuning fork tine to define a second electrode terminal.]

[13. A quartz crystal tuning fork resonator according to claim 12; wherein each of the first and second main surfaces of each of the first and second quartz crystal tuning fork tines has a central linear portion; and wherein the two stepped portions corresponding to the first and second main surfaces of each of the first and second quartz crystal tuning fork tines are disposed on opposite sides of the central linear portion.]

[14. A quartz crystal tuning fork resonator according to claim 13; wherein when an alternating current voltage is applied between the first and second electrode terminals, the first and second quartz crystal tuning fork undergo vibration in a flexural mode of an inverse phase.]

[15. A quartz crystal tuning fork resonator according to claim 3; wherein each of the plurality of individual resonators is connected to at least one other individual resonator of the plurality of resonators through a base portion.]

[16. A quartz crystal tuning fork resonator according to claim 3; wherein each of the individual quartz crystal tuning fork resonators differs from another of the individual quartz crystal tuning fork resonators at least in one of the shape thereof and the configuration of the electrodes.]

[17. A quartz crystal tuning fork resonator according to claim 3; wherein the individual quartz crystal tuning fork resonators are electrically connected together in parallel.]

[18. A quartz crystal tuning fork resonator comprising:

a quartz crystal tuning fork base;

a plurality of quartz crystal tuning fork tines extending from the quartz crystal tuning fork base so that portions of the quartz crystal tuning fork base and portions of the quartz crystal tuning fork tines define opposite first and second main surfaces of the quartz crystal tuning fork resonator;

a first set of grooves formed in the first and second main surfaces of the quartz crystal tuning fork resonator;

a second set of grooves formed in the first and second main surfaces of the quartz crystal tuning fork resonator; and a third set of grooves formed in the first and second main surfaces of the quartz crystal tuning fork resonator and between the first and second set of grooves.]

[19. A quartz crystal tuning fork resonator according to claim 18; further comprising a first set of electrodes having the same polarity and each disposed in a respective one of the first set of grooves; and a second set of electrodes having the same polarity and each disposed in a respective one of the second set of grooves.]

[20. A quartz crystal tuning fork resonator according to claim 19; wherein the polarity of the first set of electrodes is different from the polarity of the second set of electrodes.]

[21. A quartz crystal tuning fork resonator according to claim 19; wherein the third set of grooves comprises a first pair of intermediate grooves each formed on a respective one of the first and second main surfaces and a second a second pair of intermediate grooves each formed on a respective one of the first and second main surfaces.]

[22. A quartz crystal tuning fork resonator according to claim 21; further comprising a third set of electrodes having the same polarity and each disposed in a respective one of the first pair of intermediate grooves; and a fourth set of electrodes having the same polarity and each disposed in a respective one of the second pair of intermediate grooves.]

[23. A quartz crystal tuning fork resonator according to claim 22; wherein portions of the quartz crystal tuning fork base and portions of the quartz crystal tuning fork tines define opposite first and second side surfaces of the quartz crystal tuning fork resonator; and further comprising a fifth electrode disposed on the first side surface and a sixth electrode disposed on the second side surface and having a different polarity than the fifth electrode.]

[24. A quartz crystal tuning fork resonator according to claim 23; wherein the second and fourth sets of electrodes and the fifth electrode have the same polarity; and wherein the first and third sets of electrodes and the sixth electrode have the same polarity.]

[25. A quartz crystal tuning fork resonator according to claim 24; wherein the quartz crystal tuning fork resonator is symmetrical about a central plane thereof.]

*26. A quartz crystal tuning fork resonator comprising:*

*a quartz crystal tuning fork base;*

*first and second quartz crystal tuning fork tines connected to the quartz crystal tuning fork base, each of the first and second quartz crystal tuning fork tines having a first main surface and a second main surface opposite the first main surface, each of the first and second main surfaces having a central linear portion;*

*a groove formed in the central linear portion of at least one of the first and second main surfaces of each of the first and second quartz crystal tuning fork tines, a width of the groove being greater than a distance in the width direction of the groove measured from an outer edge of the groove to an outer edge of the corresponding one of the first and second quartz crystal tuning fork tines; and*

*an electrode disposed in the groove so that the quartz crystal tuning fork resonator is capable of vibrating in a flexural mode of an inverse phase.*

*27. A quartz crystal tuning fork resonator according to claim 26; wherein the groove formed in the central linear portion of the at least one of the first and second main surfaces of each of the first and second quartz crystal tuning fork tines is formed in the central linear portion of each of the first and second main surfaces of each of the first and second quartz crystal tuning fork tines, the grooves in the central linear portions of the first and second main surfaces of each of the first and second quartz crystal tuning fork tines being disposed opposite each other in a thickness direction of the first and second quartz crystal tuning fork tines.*

*28. A quartz crystal tuning fork resonator according to claim 27; wherein at least one of the grooves formed in the central linear portions of each of the first and second quartz crystal tuning fork tines extends in the quartz crystal tuning fork base.*

*29. A quartz crystal tuning fork resonator according to claim 27; wherein each of the first and second quartz crystal tuning fork tines has a first side surface and a second side surface opposite the first side surface; wherein the electrode comprises a first electrode disposed in the groove formed in the central linear portion of each of the first and second main surfaces of each of the first and second quartz crystal tuning fork tines and a second electrode disposed on each of the first and second side surfaces of each of the first and second quartz crystal tuning fork tines so that the quartz crystal tuning fork resonator is capable of vibrating in a flexural mode of an inverse phase; wherein the first electrode disposed in the groove formed in the central linear portion of the first main surface of the first quartz crystal tuning fork tine has the same electrical polarity as the first electrode*

*disposed in the groove formed in the central linear portion of the second main surface of the first quartz crystal tuning fork tine; wherein the first electrode disposed in the groove formed in the central linear portion of the first main surface of the second quartz crystal tuning fork tine has the same electrical polarity as the first electrode disposed in the groove formed in the central linear portion of the second main surface of the second quartz crystal tuning fork tine; and wherein the first electrodes of the first quartz crystal tuning fork tine have an electrical polarity opposite to an electrical polarity of the first electrodes of the second quartz crystal tuning fork tine.*

*30. A quartz crystal tuning fork resonator according to claim 29; wherein the first electrode disposed in the groove formed in each of the first and second main surfaces of each of the first and second quartz crystal tuning fork tines extends on a surface adjacent to the groove; wherein the groove formed in each of the first and second main surfaces of each of the first and second quartz crystal tuning fork tines has a base portion and a stepped portion; wherein the first electrode is disposed on each of the base portion and the stepped portion of the groove formed in each of the first and second main surfaces of each of the first and second quartz crystal tuning fork tines; wherein the first electrodes disposed on the base portions and the stepped portions of the grooves of the first quartz crystal tuning fork tine are connected to the second electrodes disposed on the first and second side surfaces of the second quartz crystal tuning fork tine; wherein the first electrodes disposed on the base portions and the stepped portions of the grooves of the second quartz crystal tuning fork tine are connected to the second electrodes disposed on the first and second side surfaces of the first quartz crystal tuning fork tine; and wherein a width of the groove formed in each of the first and second main surfaces of each of the first and second quartz crystal tuning fork tines is greater than a distance in the width direction of the groove measured from an outer edge of the groove to an outer edge of the corresponding one of the first and second quartz crystal tuning fork tines.*

*31. A quartz crystal tuning fork resonator according to claim 30; wherein the surface adjacent to the groove formed in the first main surface of each of the first and second quartz crystal tuning fork tines comprises the first main surface; and wherein the surface adjacent to the groove formed in the second main surface of each of the first and second quartz crystal tuning fork tines comprises the second main surface.*

*32. A quartz crystal tuning fork resonator according to claim 29; wherein a third electrode is disposed on at least one of the first and second main surfaces of each of the first and second quartz crystal tuning fork tines; wherein the groove formed in each of the first and second main surfaces of each of the first and second quartz crystal tuning fork tines has a base portion; wherein the first electrode is disposed on the base portion of the groove formed in each of the first and second main surfaces of each of the first and second quartz crystal tuning fork tines; wherein the first electrodes disposed on the base portions of the grooves of the first quartz crystal tuning fork tine are connected to the third electrode disposed on the at least one of the first and second main surfaces of the first quartz crystal tuning fork tine and the second electrodes disposed on the first and second side surfaces of the second quartz crystal tuning fork tine; and wherein the first electrodes disposed on the base portions of the grooves of the second quartz crystal tuning fork tine are connected to the third electrode disposed on the at least one of the first and second main surfaces of the second quartz crystal tuning fork tine and the second electrodes disposed on the first and second side surfaces of the first quartz crystal tuning fork tine.*

*33. A quartz crystal tuning fork resonator according to claim 29; wherein the groove formed in the central linear portion of each of the first and second main surfaces of each of the first and second quartz crystal tuning fork tines has a width $W_2$ greater than a distance $W_1$ extending between a first side of the groove and a first side of the corresponding one of the first and second quartz crystal tuning fork tines and a distance $W_3$ extending between a second side of the groove and a second side of the corresponding one of the first and second quartz crystal tuning fork tines; wherein each of the first and second quartz crystal tuning fork tines comprises a third main surface having $W_1$ and a fourth main surface having $W_3$, a third electrode being disposed on at least one of the third and fourth main surfaces of each of the first and second quartz crystal tuning fork tines; wherein the first electrodes disposed in the grooves of the first quartz crystal tuning fork tine are connected to the third electrode disposed on the at least one of the third and fourth main surfaces of the first quartz crystal tuning fork tine and the second electrodes disposed on the first and second side surfaces of the second quartz crystal tuning fork tine; and wherein the first electrodes disposed in the grooves of the second quartz crystal tuning fork tine are connected to the third electrode disposed on the at least one of the third and fourth main surfaces of the second quartz crystal tuning fork tine and the second electrodes disposed on the first and second side surfaces of the first quartz crystal tuning fork tine.*

*34. A quartz crystal tuning fork resonator according to claim 33; wherein the groove formed in the central linear portion of each of the first and second main surfaces of each of the first and second quartz crystal tuning fork tines has a base portion and a stepped portion; wherein the first electrode is disposed on each of the base portion and the stepped portion of the groove formed in the central linear portion of each of the first and second main surfaces of each of the first and second quartz crystal tuning fork tines; wherein the first electrodes disposed on the base portions and the stepped portions of the grooves of the first quartz crystal tuning fork tine are connected to the third electrode disposed on the at least one of the third and fourth main surfaces of the first quartz crystal tuning fork tine and the second electrodes disposed on the first and second side surfaces of the second quartz crystal tuning fork tine to form a first electrode terminal; wherein the first electrodes disposed on the base portions and the stepped portions of the grooves of the second quartz crystal tuning fork tine are connected to the third electrode disposed on the at least one of the third and fourth main surfaces of the second quartz crystal tuning fork tine and the second electrodes disposed on the first and second side surfaces of the first quartz crystal tuning fork tine to form a second electrode terminal; and wherein when an alternating current voltage is applied between the first and second electrode terminals, the quartz crystal tuning fork resonator is capable of vibrating in a flexural mode of an inverse phase.*

*35. A quartz crystal tuning fork resonator according to claim 34; wherein each of the third and fourth main surfaces adjacent to the groove formed in the central linear portion of the first main surface of each of the first and second quartz crystal tuning fork tines comprises the first main surface; and wherein each of the third and fourth main surfaces adjacent to the groove formed in the central linear portion of the second main surface of each of the first and second quartz crystal tuning fork tines comprises the second main surface.*

*36. A quartz crystal tuning fork resonator according to claim 29; wherein each of the first and second quartz crystal*

*tuning fork tines has a third main surface and a fourth main surface opposite the third main surface; wherein each of the third and fourth main surfaces is located between outer edges of the groove and outer edges of corresponding one of the first and second quartz crystal tuning fork tines and has a distance in the width direction of the groove measured from one of the outer edges of the groove to one of the outer edges of the corresponding one of the first and second quartz crystal tuning fork tines; wherein a third electrode is disposed on each of the third and fourth main surfaces of each of the first and second quartz crystal tuning fork tines; and wherein the third electrode disposed on each of the third and fourth main surfaces of each of the first and second quartz crystal tuning fork tines is connected to the first electrode disposed in the groove adjacent to the third electrode.*

*37. A quartz crystal tuning fork resonator according to claim 36; wherein the groove formed in the central linear portion of each of the first and second main surfaces of each of the first and second quartz crystal tuning fork tines has a base portion and a stepped portion; wherein the first electrode is disposed on each of the base portion and the stepped portion of the groove formed in the central linear portion of each of the first and second main surfaces of each of the first and second quartz crystal tuning fork tines; wherein the first electrodes disposed on the base portions and the stepped portions of the grooves of the first quartz crystal tuning fork tine are connected to the third electrodes disposed on the third and fourth main surfaces of the first quartz crystal tuning fork tine and the second electrodes disposed on the first and second side surfaces of the second quartz crystal tuning fork tine; wherein the first electrodes disposed on the base portions and the stepped portions of the grooves of the second quartz crystal tuning fork tine are connected to the third electrodes disposed on the third and fourth main surfaces of the second quartz crystal tuning fork tine and the second electrodes disposed on the first and second side surfaces of the first quartz crystal tuning fork tine; and wherein a width of at least one of the grooves formed in the first and second main surfaces of each of the first and second quartz crystal tuning fork tines is greater than the distance in the width direction of the groove measured from one of the outer edges of the groove to one of the outer edges of the corresponding one of the first and second quartz crystal tuning fork tines.*

*38. A quartz crystal tuning fork resonator according to claim 37; wherein the third main surface of each of the first and second quartz crystal tuning fork tines comprises the first main surface; and wherein the fourth main surface of each of the first and second quartz crystal tuning fork tines comprises the second main surface.*

*39. A quartz crystal tuning fork resonator according to claim 26; wherein the groove formed in the central linear portion of at least one of the first and second main surfaces of each of the first and second quartz crystal tuning fork tines is formed in the central linear portion of each of the first and second main surfaces of each of the first and second quartz crystal tuning fork tines; wherein the groove formed in the central linear portion of each of the first and second main surfaces of each of the first and second quartz crystal tuning fork tines has a width $W_2$ greater than a distance $W_1$ extending between a first side of the groove and a first side of the corresponding one of the first and second quartz crystal tuning fork tines and a distance $W_3$ extending between a second side of the groove and a second side of the corresponding one of the first and second quartz crystal tuning fork tines; wherein each of the first and second quartz crystal tuning fork tines has a first side surface and a second side surface opposite the first side surface; wherein a first electrode is disposed in the groove formed in the central linear portion of each of the first and second main surfaces of each of the first and second quartz crystal tuning fork tines and a second electrode is disposed on each of the first and second side surfaces of each of the first and second quartz crystal tuning fork tines so that the quartz crystal tuning fork resonator is capable of vibrating in a flexural mode of an inverse phase; and wherein the first electrodes of the first quartz crystal tuning fork tine have an electrical polarity opposite to an electrical polarity of the first electrodes of the second quartz crystal tuning fork tine.*

*40. A quartz crystal tuning fork resonator according to claim 39; wherein the groove formed in each of the first and second main surfaces of each of the first and second quartz crystal tuning fork tines has a base portion and a stepped portion; wherein the first electrode is disposed on each of the base portion and the stepped portion of the groove formed in each of the first and second main surfaces of each of the first and second quartz crystal tuning fork tines; wherein the first electrode disposed on the base portion of the groove formed in each of the first and second main surfaces of each of the first and second quartz crystal tuning fork tines extends on a surface adjacent to the groove; wherein the first electrodes disposed on the base portions of the grooves of the first quartz crystal tuning fork tine are connected to the second electrodes disposed on the first and second side surfaces of the second quartz crystal tuning fork tine; and wherein the first electrodes disposed on the base portions of the grooves of the second quartz crystal tuning fork tine are connected to the second electrodes disposed on the first and second side surfaces of the first quartz crystal tuning fork tine.*

*41. A quartz crystal tuning fork resonator according to claim 39; wherein the groove formed in each of the first and second main surfaces of each of the first and second quartz crystal tuning fork tines has a base portion and a stepped portion; wherein the first electrode is disposed on each of the base portion and the stepped portion of the groove formed in each of the first and second main surfaces of each of the first and second quartz crystal tuning fork tines; wherein the first electrode disposed on each of the base portion and the stepped portion of the groove formed in the first main surface of each of the first and second quartz crystal tuning fork tines extends on the first main surface adjacent to the groove; wherein the first electrode disposed on each of the base portion and the stepped portion of the groove formed in the second main surface of each of the first and second quartz crystal tuning fork tines extends on the second main surface adjacent to the groove; wherein the first electrodes disposed on the base portions and the stepped portions of the grooves of the first quartz crystal tuning fork tine are connected to the second electrodes disposed on the first and second side surfaces of the second quartz crystal tuning fork tine; and wherein the first electrodes disposed on the base portions and the stepped portions of the grooves of the second quartz crystal tuning fork tine are connected to the second electrodes disposed on the first and second side surfaces of the first quartz crystal tuning fork tine.*

*42. A quartz crystal tuning fork resonator comprising:*

*a quartz crystal tuning fork base;*

*first and second quartz crystal tuning fork tines connected to the quartz crystal tuning fork base, each of the first and second quartz crystal tuning fork tines having a first main surface and a second main surface opposite the first main surface and a first side surface and a second side surface opposite the first side surface, each of the first and second main surfaces having a central linear portion;*

*a groove having a base portion and a stepped portion and formed in the central linear portion of each of the first and second main surfaces of each of the first and second quartz crystal tuning fork tines so that a width of the groove formed in the central linear portion of each of the first and second main surfaces of each of the first and second quartz crystal tuning fork tines is greater than a distance in the width direction of the groove measured from an outer edge of the groove to an outer edge of the corresponding one of the first and second quartz crystal tuning fork tines;*

*a first electrode disposed on each of the base portion and the stepped portion of the groove formed in the central linear portion of each of the first and second main surfaces of each of the first and second quartz crystal tuning fork tines;*

*a second electrode disposed on each of the first and second side surfaces of each of the first and second quartz crystal tuning fork tines; and*

*a third electrode disposed on each of the first and second main surfaces of each of the first and second quartz crystal tuning fork tines;*

*wherein the first electrodes disposed on the base portions and the stepped portions of the first quartz crystal tuning fork tine are connected to the second electrodes disposed on the first and second side surfaces of the second quartz crystal tuning fork tine and the third electrodes disposed on the first and second main surfaces of the first quartz crystal tuning fork tine to form a first electrode terminal, and the first electrodes disposed on the base portions and the stepped portions of the second quartz crystal tuning fork tine are connected to the second electrodes disposed on the first and second side surfaces of the first quartz crystal tuning fork tine and the third electrodes disposed on the first and second main surfaces of the second quartz crystal tuning fork tine to form a second electrode terminal; and*

*wherein when an alternating current voltage is applied between the first and second electrode terminals, the quartz crystal tuning fork resonator is capable of vibrating in a flexural mode of an inverse phase.*

*43. A quartz crystal tuning fork resonator according to claim 42; wherein the base portions of the grooves in the first and second main surfaces of each of the first and second quartz crystal tuning fork tines are disposed opposite each other in a thickness direction of the first and second quartz crystal tuning fork tines; wherein the first electrode disposed on the base portion of the groove is connected to the third electrode adjacent to the groove through the first electrode disposed on the stepped portion of the groove; and wherein the first electrodes disposed on the base portions of the grooves of the first quartz crystal tuning fork tine have an electrical polarity opposite to an electrical polarity of the first electrodes disposed on the base portions of the grooves of the second quartz crystal tuning fork tine.*

*44. A quartz crystal tuning fork resonator comprising:*

*a quartz crystal tuning fork base;*

*first and second quartz crystal tuning fork tines connected to the quartz crystal tuning fork base, each of the first and second quartz crystal tuning fork tines having a first main surface and a second main surface opposite the first main surface and a first side surface and a second side surface opposite the first side surface, each of the first and second main surfaces having a central linear portion;*

*a groove having a width $W_2$ and a base portion and formed in the central linear portion of each of the first and second main surfaces of each of the first and second quartz crystal tuning fork tines so that the width $W_2$ of the groove formed in the central linear portion of each of the first and second main surfaces of each of the first and second quartz crystal tuning fork tines is greater than a distance $W_1$ extending between a first side of the groove and a first side of the corresponding one of the first and second quartz crystal tuning fork tines and a distance $W_3$ extending between a second side of the groove and a second side of the corresponding one of the first and second quartz crystal tuning fork tines;*

*a first electrode disposed on the base portion of the groove formed in the central linear portion of each of the first and second main surfaces of each of the first and second quartz crystal tuning fork tines;*

*a second electrode disposed on each of the first and second side surfaces of each of the first and second quartz crystal tuning fork tines; and*

*a third electrode disposed on each of the first and second main surfaces of each of the first and second quartz crystal tuning fork tines;*

*wherein the first electrodes disposed on the base portions of the grooves of the first quartz crystal tuning fork tine are connected to the second electrodes disposed on the first and second side surfaces of the second quartz crystal tuning fork tine and the third electrodes disposed on the first and second main surfaces of the first quartz crystal tuning fork tine to form a first electrode terminal, and the first electrodes disposed on the base portions of the grooves of the second quartz crystal tuning fork tine are connected to the second electrodes disposed on the first and second side surfaces of the first quartz crystal tuning fork tine and the third electrodes disposed on the first and second main surfaces of the second quartz crystal tuning fork tine to form a second electrode terminal; and*

*wherein when an alternating current voltage is applied between the first and second electrode terminals, the quartz crystal tuning fork resonator is capable of vibrating in a flexural mode of an inverse phase.*

*45. A quartz crystal tuning fork resonator according to claim 44; wherein the groove formed in each of the first and second main surfaces of each of the first and second quartz crystal tuning fork tines has a stepped portion; wherein the first electrode is disposed on the stepped portion; wherein the first electrode disposed on the base portion of the groove is connected to the third electrode adjacent to the groove through the first electrode disposed on the stepped portion of the groove; and wherein the first electrodes disposed on the base portions of the grooves of the first quartz crystal tuning fork tine have an electrical polarity opposite to an electrical polarity of the first electrodes disposed on the base portions of the grooves of the second quartz crystal tuning fork tine.*

* * * * *